(12) United States Patent
Bennett

(10) Patent No.: US 8,028,186 B2
(45) Date of Patent: Sep. 27, 2011

(54) SKEW MANAGEMENT IN AN INTERCONNECTION SYSTEM

(75) Inventor: Jon C. R. Bennett, Sudbury, MA (US)

(73) Assignee: Violin Memory, Inc., Mountain View, CA (US)

(*) Notice: Subject to any disclaimer, the term of this patent is extended or adjusted under 35 U.S.C. 154(b) by 502 days.

(21) Appl. No.: 11/975,269

(22) Filed: Oct. 17, 2007

(65) Prior Publication Data

US 2009/0043933 A1 Feb. 12, 2009

Related U.S. Application Data

(60) Provisional application No. 60/853,852, filed on Oct. 23, 2006.

(51) Int. Cl.
*G06F 1/04* (2006.01)

(52) U.S. Cl. .......... 713/503; 710/38; 710/316; 710/317; 327/149; 327/152; 327/153; 327/270; 327/271; 714/700

(58) Field of Classification Search .................. 710/316, 710/317, 38; 709/241; 340/825.2; 327/149, 327/152, 153, 261, 262, 271, 276, 269–270; 714/700; 713/503; 716/113
See application file for complete search history.

(56) References Cited

U.S. PATENT DOCUMENTS

| | | | |
|---|---|---|---|
| 3,728,679 A * | 4/1973 | McIntosh | 714/700 |
| 3,970,798 A | 7/1976 | Epenoy et al. | |
| 4,128,882 A | 12/1978 | Dennis | |
| 4,240,143 A | 12/1980 | Besemer et al. | |
| 4,263,651 A * | 4/1981 | Donath et al. | 716/108 |
| 4,322,849 A | 3/1982 | Calabrese | |
| 4,323,849 A | 4/1982 | Smith | |
| 4,363,094 A | 12/1982 | Kaul | |
| 4,383,314 A | 5/1983 | Tam | |
| 4,386,323 A | 5/1983 | Jansen | |
| 4,543,630 A | 9/1985 | Neches | |
| 4,558,455 A | 12/1985 | Epenoy et al. | |
| 4,701,756 A | 10/1987 | Burr | |
| 4,703,451 A | 10/1987 | Calabrese | |
| 4,756,011 A | 7/1988 | Cordell | |

(Continued)

FOREIGN PATENT DOCUMENTS

EP 1 369 767 A2 12/2003

(Continued)

OTHER PUBLICATIONS

Lee et al. Inter-Pin Skew Compensation Scheme for 3.2-Gb/s/pin Parallel Interface. Journal of Semiconductor Technology and Science. vol. 10. No. 1. Mar. 2010.*

(Continued)

*Primary Examiner* — Matthew Spittle
(74) *Attorney, Agent, or Firm* — Brinks Hofer Gilson & Lione

(57) ABSTRACT

An interconnection system is described where data lanes may be exchanged between lines at intervals along a transmission path so that the differential time delay between bits on a plurality of the lines is reduced when determined at a receiving location. The data lanes may be bound to the lines through the operation of a configurable switch, or by a configurable switch in conjunction with predetermined manufactured connections, or a combination of the techniques. The wiring of a connectorized node module, which may include a memory device, may be configured so that the differential time delay between pairs of input lines of a node, as measured at the output of a node, is reduced.

10 Claims, 17 Drawing Sheets

U.S. PATENT DOCUMENTS

| | | | | |
|---|---|---|---|---|
| 4,805,195 | A * | 2/1989 | Keegan | 375/354 |
| 4,820,944 | A * | 4/1989 | Herlein et al. | 327/270 |
| 4,845,709 | A | 7/1989 | Matsumoto et al. | |
| 4,860,201 | A | 8/1989 | Stolfo et al. | |
| 4,881,165 | A | 11/1989 | Sager et al. | |
| 4,910,669 | A | 3/1990 | Gorin et al. | |
| 4,922,409 | A | 5/1990 | Schoellkopf et al. | |
| 5,041,964 | A | 8/1991 | Cole et al. | |
| 5,053,942 | A | 10/1991 | Srini | |
| 5,175,640 | A * | 12/1992 | Eng et al. | 398/47 |
| 5,200,746 | A * | 4/1993 | Yoshifuji | 340/2.22 |
| 5,283,877 | A | 2/1994 | Gastinel | |
| 5,285,441 | A * | 2/1994 | Bansal et al. | 370/218 |
| 5,313,501 | A * | 5/1994 | Thacker | 375/369 |
| 5,365,487 | A | 11/1994 | Patel et al. | |
| 5,379,262 | A | 1/1995 | Okamoto | |
| 5,467,040 | A | 11/1995 | Nelson et al. | |
| 5,507,029 | A * | 4/1996 | Granato et al. | 716/113 |
| 5,513,377 | A * | 4/1996 | Capowski et al. | 710/61 |
| 5,621,774 | A * | 4/1997 | Ishibashi et al. | 375/371 |
| 5,828,253 | A | 10/1998 | Murayama | |
| 5,872,959 | A * | 2/1999 | Nguyen et al. | 713/401 |
| 5,889,714 | A | 3/1999 | Schumann et al. | |
| 5,920,704 | A * | 7/1999 | Olnowich et al. | 709/238 |
| 5,923,830 | A | 7/1999 | Fuch et al. | |
| 5,960,034 | A | 9/1999 | Lo | |
| 5,974,503 | A | 10/1999 | Venkatesh | |
| 6,009,547 | A | 12/1999 | Jaquette | |
| 6,031,847 | A * | 2/2000 | Collins et al. | 370/508 |
| 6,105,144 | A * | 8/2000 | Wu | 713/401 |
| 6,134,167 | A | 10/2000 | Atkinson | |
| 6,138,185 | A * | 10/2000 | Nelson et al. | 710/33 |
| 6,157,229 | A * | 12/2000 | Yoshikawa | 327/149 |
| 6,185,654 | B1 | 2/2001 | Van Doren | |
| 6,208,667 | B1 * | 3/2001 | Caldara et al. | 370/503 |
| 6,237,052 | B1 | 5/2001 | Stolowitz | |
| 6,301,244 | B1 * | 10/2001 | Huang et al. | 370/351 |
| 6,310,814 | B1 | 10/2001 | Hampel et al. | |
| 6,317,352 | B1 | 11/2001 | Halbert et al. | |
| 6,334,167 | B1 | 12/2001 | Gerchman et al. | |
| 6,335,647 | B1 * | 1/2002 | Nagano | 327/161 |
| 6,335,930 | B1 * | 1/2002 | Lee | 370/387 |
| 6,345,321 | B1 | 2/2002 | Litaize et al. | |
| 6,356,610 | B1 | 3/2002 | Ott | |
| 6,359,815 | B1 * | 3/2002 | Sato et al. | 365/198 |
| 6,369,605 | B1 | 4/2002 | Bonella et al. | |
| 6,370,200 | B1 * | 4/2002 | Takahashi | 375/257 |
| 6,417,713 | B1 * | 7/2002 | DeRyckere et al. | 327/271 |
| 6,425,114 | B1 * | 7/2002 | Chan et al. | 716/113 |
| 6,442,644 | B1 | 8/2002 | Gustavson et al. | |
| 6,445,719 | B1 | 9/2002 | Schneider et al. | |
| 6,446,174 | B1 | 9/2002 | Dow | |
| 6,449,667 | B1 | 9/2002 | Ganmukhi et al. | |
| 6,473,827 | B2 * | 10/2002 | McMillen et al. | 710/316 |
| 6,493,205 | B2 | 12/2002 | Bauer | |
| 6,493,250 | B2 | 12/2002 | Halbert et al. | |
| 6,502,161 | B1 | 12/2002 | Perego et al. | |
| 6,518,812 | B1 * | 2/2003 | Sikkink et al. | 327/284 |
| 6,553,450 | B1 | 4/2003 | Dodd et al. | |
| 6,557,110 | B2 * | 4/2003 | Sakamoto et al. | 713/503 |
| 6,591,339 | B1 | 7/2003 | Horst | |
| 6,611,518 | B1 * | 8/2003 | Ngo et al. | 370/386 |
| 6,625,687 | B1 | 9/2003 | Halbert et al. | |
| 6,636,932 | B1 * | 10/2003 | Regev et al. | 710/317 |
| 6,636,993 | B1 * | 10/2003 | Koyanagi et al. | 714/700 |
| 6,647,027 | B1 * | 11/2003 | Gasparik et al. | 370/519 |
| 6,658,509 | B1 | 12/2003 | Bonella et al. | |
| 6,667,927 | B2 | 12/2003 | Jones, Jr. | |
| 6,678,783 | B2 * | 1/2004 | Ozawa | 710/316 |
| 6,681,338 | B1 | 1/2004 | Kollipara | |
| 6,697,974 | B2 * | 2/2004 | Craft | 714/700 |
| 6,735,397 | B2 * | 5/2004 | Herrity | 398/158 |
| 6,799,235 | B2 | 9/2004 | Borman et al. | |
| 6,803,872 | B2 * | 10/2004 | DeRyckere et al. | 341/160 |
| 6,807,377 | B1 * | 10/2004 | Watanabe | 398/154 |
| 6,833,618 | B2 | 12/2004 | Ono et al. | |
| 6,871,253 | B2 | 3/2005 | Greef et al. | |
| 6,874,097 | B1 * | 3/2005 | Aliahmad et al. | 713/401 |
| 6,882,082 | B2 | 4/2005 | Greef et al. | |
| 6,898,742 | B2 * | 5/2005 | Koyanagi et al. | 714/700 |
| 6,904,050 | B2 | 6/2005 | Chao | |
| 6,928,571 | B1 | 8/2005 | Bonella et al. | |
| 6,937,681 | B2 * | 8/2005 | Watanabe | 375/371 |
| 6,961,347 | B1 | 11/2005 | Bunton et al. | |
| 6,983,354 | B2 | 1/2006 | Jeddeloh | |
| 6,998,892 | B1 * | 2/2006 | Nguyen et al. | 327/161 |
| 7,012,811 | B1 | 3/2006 | Jiang et al. | |
| 7,013,361 | B2 * | 3/2006 | Liron | 710/316 |
| 7,064,992 | B2 | 6/2006 | Bell et al. | |
| 7,065,101 | B2 | 6/2006 | Ziegler et al. | |
| 7,085,950 | B2 * | 8/2006 | Ehmann et al. | 713/503 |
| 7,113,012 | B2 * | 9/2006 | Amin | 327/161 |
| 7,123,660 | B2 * | 10/2006 | Haq et al. | 375/257 |
| 7,130,317 | B2 * | 10/2006 | Annadurai et al. | 370/516 |
| 7,139,347 | B2 * | 11/2006 | Fujita et al. | 375/371 |
| 7,193,429 | B2 * | 3/2007 | Okuyama | 326/26 |
| 7,200,790 | B2 | 4/2007 | Sharma et al. | |
| 7,205,803 | B2 * | 4/2007 | Chung et al. | 327/158 |
| 7,280,538 | B2 * | 10/2007 | Li | 370/390 |
| 7,304,520 | B2 * | 12/2007 | Cho et al. | 327/277 |
| 7,328,362 | B2 * | 2/2008 | Chiang | 713/503 |
| 7,401,246 | B2 * | 7/2008 | Martin et al. | 713/500 |
| 7,430,728 | B1 * | 9/2008 | Rahut | 716/113 |
| 7,433,441 | B2 * | 10/2008 | Jenkins et al. | 375/371 |
| 7,490,189 | B2 * | 2/2009 | Eberle et al. | 710/317 |
| 7,525,356 | B2 * | 4/2009 | Hui et al. | 327/161 |
| 7,551,640 | B1 | 6/2009 | Klecka et al. | |
| 7,609,695 | B2 * | 10/2009 | Zhu et al. | 370/392 |
| 7,643,517 | B2 * | 1/2010 | Annadurai et al. | 370/516 |
| 7,653,776 | B2 * | 1/2010 | Cornelius et al. | 710/316 |
| 7,668,271 | B2 | 2/2010 | Kim et al. | |
| 7,668,272 | B1 | 2/2010 | Obeidat | |
| 7,751,713 | B2 * | 7/2010 | Perkins et al. | 398/81 |
| 7,817,767 | B2 | 10/2010 | Tell et al. | |
| 2001/0039601 | A1 | 11/2001 | Leung | |
| 2002/0009169 | A1 * | 1/2002 | Watanabe | 375/371 |
| 2002/0084458 | A1 | 7/2002 | Halbert et al. | |
| 2002/0112119 | A1 | 8/2002 | Halbert et al. | |
| 2002/0124153 | A1 | 9/2002 | Litaize et al. | |
| 2003/0001880 | A1 | 1/2003 | Holtz | |
| 2003/0018880 | A1 | 1/2003 | Litaize et al. | |
| 2003/0019327 | A1 | 1/2003 | Fujimoto | |
| 2003/0046489 | A1 | 3/2003 | Yagi | |
| 2003/0058021 | A1 | 3/2003 | Lee et al. | |
| 2003/0061447 | A1 | 3/2003 | Perego et al. | |
| 2003/0095500 | A1 * | 5/2003 | Annadurai et al. | 370/516 |
| 2003/0105928 | A1 | 6/2003 | Ash | |
| 2003/0117172 | A1 | 6/2003 | Wu et al. | |
| 2003/0120895 | A1 | 6/2003 | Litaize et al. | |
| 2003/0163606 | A1 | 8/2003 | Fukaishi et al. | |
| 2003/0193927 | A1 | 10/2003 | Hronik | |
| 2003/0208511 | A1 | 11/2003 | Earl et al. | |
| 2003/0236939 | A1 | 12/2003 | Kleveland et al. | |
| 2004/0004897 | A1 | 1/2004 | Kang | |
| 2004/0117569 | A1 | 6/2004 | Kyung | |
| 2004/0122985 | A1 | 6/2004 | Parra et al. | |
| 2004/0153817 | A1 | 8/2004 | Norman | |
| 2004/0230718 | A1 | 11/2004 | Polzin et al. | |
| 2004/0243769 | A1 | 12/2004 | Frame et al. | |
| 2004/0256638 | A1 | 12/2004 | Perego et al. | |
| 2005/0005184 | A1 | 1/2005 | Lindt | |
| 2005/0007805 | A1 | 1/2005 | Ware et al. | |
| 2005/0010737 | A1 | 1/2005 | Ware et al. | |
| 2005/0060483 | A1 | 3/2005 | Azuma | |
| 2005/0071693 | A1 | 3/2005 | Chun et al. | |
| 2005/0078506 | A1 | 4/2005 | Rao et al. | |
| 2005/0086549 | A1 | 4/2005 | Solomon et al. | |
| 2005/0246362 | A1 | 11/2005 | Borland | |
| 2005/0259692 | A1 | 11/2005 | Zerbe | |
| 2006/0136767 | A1 | 6/2006 | Ma | |
| 2006/0143372 | A1 | 6/2006 | Walker et al. | |
| 2006/0179334 | A1 | 8/2006 | Brittain et al. | |
| 2006/0187715 | A1 | 8/2006 | Narvaez | |
| 2006/0253721 | A1 | 11/2006 | Johnson | |
| 2006/0277310 | A1 * | 12/2006 | Kalos et al. | 709/228 |
| 2006/0288241 | A1 | 12/2006 | Felter et al. | |
| 2007/0002663 | A1 | 1/2007 | Schaefer | |

| | | | |
|---|---|---|---|
| 2007/0079219 | A1 | 4/2007 | Nagai |
| 2007/0088754 | A1 | 4/2007 | Brannon et al. |
| 2007/0101075 | A1 | 5/2007 | Jeddeloh |
| 2007/0113029 | A1 | 5/2007 | Bennett |
| 2007/0124532 | A1 | 5/2007 | Bennett |
| 2007/0162516 | A1 | 7/2007 | Thiel et al. |
| 2008/0168304 | A1 | 7/2008 | Flynn et al. |
| 2008/0175586 | A1* | 7/2008 | Perkins et al. ............ 398/2 |
| 2008/0175589 | A1* | 7/2008 | Perkins et al. ............ 398/34 |
| 2008/0183953 | A1 | 7/2008 | Flynn et al. |
| 2009/0052892 | A1* | 2/2009 | Perkins et al. ............ 398/34 |
| 2009/0324220 | A1* | 12/2009 | Perkins et al. ............ 398/48 |

FOREIGN PATENT DOCUMENTS

| | | |
|---|---|---|
| WO | WO 99/30240 | 6/1999 |
| WO | WO 99/41667 | 8/1999 |

OTHER PUBLICATIONS

Hu et al. Inter-Signal Timing Skew Compensation of Parallel Links with Voltage-Mode Incremental Signaling. IEEE. 2008.*

Chakraborty et al. Dynamic Thermal Clock Skew Compensation using Tunable Delay Buffers. ACM. 2006.*

International Search Report for International Application No. PCT/US2007/022316, dated Mar. 28, 2008, 3 pages.

"Cycletrees: Flexible Interconnection Graphs for Parallel Computing", by Margus Veanes & Jonas Barklund, 36 p., UPMAIL Technical Report No. 97, Uppsala, Sweden, Feb. 21, 1995.

"X-Tree: A Tree Structured Multi-Proce3ssor Computer Architecture", by Alvin M. Despain and David A. Patterson; University of California/Computer Science Division, Berkeley, CA, p. 144-151.

"Communication in X-Tree, a Modular Multiprocessor System", by C.H. Sequin, A.M.Despain, D.A. Patterson; University of California, Computer Science Division, Electrical Engineering & Computer Sciences; Berkeley, CA, p. 194-203; 1978.

"A Graph for Interconnecting Processors in Parallel Computing", by Hong Xie; Murdock University, Murdoch, W.A, 6150 Australia; Proc. ICCI'94, p. 885-901; 1994 Int. Conf. on Computing and Information.

"A High-Speed Channel Controller for the Chaos Router", by Robert Wille; p. 1-21; Dec. 8, 1992.

"The Alewife CMMU: Addressing the Multiprocessor Communications Gap", by J. Kubiatowicz, D. Chaiken, A. Agarwal; Massachusetts Institute of Technology, Laboratory for Computer Science, Cambridge, MA; p. 1-3.

"Performance Evaluation of Switch-Based Wormhole Networks", by Lionel M. Ni, Yadong Gui, Sherry Moore; 1045-9219/97—1997 IEEE; p. 462-474.

Hans-Peter Messer: "PC—Hardwarebuch" 1995, Addison-Wesley, Bonn XP002412835 pp. 31-36, pp. 580-583.

International Search Report from PCT application No. PCT/US2006/014527 dated Apr. 10, 2007 (7 pages).

Written Opinion of the International Searching Authority from the International Search Report from PCT application No. PCT/US2006/014527 dated Apr. 10, 2007 (9 pages).

$Int_e l$®, "Understanding the Flash Translation Layer (FTL) Specification," Dec. 1998, Order No. 297816-002, Copyright © Intel Corporation 1997, 1998, pp. 1-20.

Graefe, G., "Write-Optimized B-Trees," Proceedings of the $30^{th}$ VLDB Conference, Toronto, Canada, 2004, pp. 672-683.

Jeffery, C.A., "Performance Analysis of Dynamic Sparing and Error Correction Techniques for Fault Tolerance in Nanoscale Memory Structures," Thesis Presentation to the University of Florida, 2004, 104 pages.

Juonolainen, M. K., "Cand Scient Thesis," University of Oslo, Jan. 2, 1999, 129 pages.

Norvag, K., et al., "Log-Only Temporal Object Storage," Copyright 1997 IEEE, published in the Proceedings of DEXA'97, Sep. 1-2, 1997, Toulouse, France, 6 pages.

Sanders, D.A., et al., "Terabyte IDE RAID-5 Disk Arrays," 2003 Conference for Computing in High Energy and Nuclear Physics, LaJolla, California, Mar. 24-28, 2003, pp. 1-8.

Shirriff, K.W., "Sawmill: A Logging File System for a High-Performance RAID Disk Array," Dissertation Presentation, University of California, 1995, pp. 164.

Notification of the First Office Action dated Dec. 26, 2008 from the Patent Office of People's Republic of China for Chinese Patent Application No. 2006800130653, 7 pages.

AbouGhazeleh, N., et al., "Energy Conservation in Memory Hierarchies using Power-Aware Cached-DRAM," Department of Computer Science, University of Pittsburgh, Technical Report: TR-05-123, pp. 1-23.

Fan, X., et al., "Modeling of DRAM Power Control Policies Using Deterministic and Stochastic Petri Nets," Department of Computer Science, Duke University, Durham, NC 27708, USA, 11 pages.

Park, J., et al., "Coarse-Grained DRAM Power Management," Department of Computer Science, Department of Electrical Engineering and Computer Engineering, State University of New York at New Paltz, New Paltz., NY 12561, U.S.A., 7 pages.

Rajamani, K., et al., "Evaluating Power Management Strategies for High Performance Memory (DRAM): A Case Study for Achieving Effective Analysis by Combining Simulation Platforms and Real Hardware Performance Monitoring," IBM Austin Research Lab, 10 pages.

Fan, X., et al., "Memory Controller Policies for DRAM Power Management," ISPLED'01, Aug. 6-7, 2001, Huntington Beach, California, USA, Copyright 2001 ACM 1-58113-371-5/01/0008, 6 pages.

Micron, "Calculating Memory System Power for DDR," © 2001 Micron Technology, Inc., pp. 1-26.

Micron, "Mobile SDRAM Power-Saving Features," © 2002 Micron Technology, Inc., pp. 1-3.

Micron, "DDR2 'CKE Power-Down Requirement," © 2003 Micron Technology, Inc., pp. 1-3.

Micron, "DDR2 (Point-to-Point) Features and Functionality," © 2003 Micron Technology, Inc., pp. 1-14.

Pharris, B., "The SCALE DRAM Subsystem," Massachusetts Institute of Technology, May 2004, pp. 1-79.

Despaux, O., "DDR SDRAM Controller Using Virtex-4 FPGA Devices," © 2004 Xilinx, Inc., XAPP709 (v1.0) Sep. 10, 2004, pp. 1-9.

Bhalodia, V., "Scale DRAM Subsystem Power Analysis," Massachusetts Institute of Technology, Sep. 2005, pp. 1-51.

Micron, "Designing for High-Density DDR2 Memory," © 2005 Micron Technology, Inc., pp. 1-9.

Micron, "Mobile DRAM Power-Saving Features and Power Calculations," © 2005 Micron Technology, Inc., pp. 1-9.

Elpida, "Low Power Function of Mobile RAM™ Deep Power Down (DPD)," Elpida Memory, Inc. 2005-2006, Date Published May 2006 (K) Japan, URL: http://www.elpida.com, pp. 1-4.

"Mainstream Computer Components," Lec #10 Spring 2006 May 8, 2006, pp. 1-31.

Written Opinion of the International Searching Authority from the International Search Report from PCT application No. PCT/US2008/074628 dated Mar. 24, 2009, 5 pages.

International Search Report for International Application No. PCT/US2008/074628, dated Mar. 24, 2009, 3 pages.

Written Opinion of the International Searching Authority from the International Search Report from PCT application No. PCT/US2008/078752 dated Mar. 31, 2009, 5 pages.

International Search Report for International Application No. PCT/US2008/078752, dated Mar. 31, 2009, 3 pages.

Written Opinion of the International Searching Authority from the International Search Report from PCT application No. PCT/US2008/083969 dated Apr. 30, 2009, 5 pages.

International Search Report for International Application No. PCT/US2008/083969, dated Apr. 30, 2009, 3 pages.

Jul. 21, 2009 Non-Final Office Action, U.S. Appl. No. 11/405,083.

Response to Jul. 21, 2009 Non-Final Office Action, U.S. Appl. No. 11/405,083, filed in the PTO on Oct. 7, 2009.

Feb. 23, 2010 Non-Final Office Action, U.S. Appl. No. 11/405,083 (19 pages).

Response to Feb. 23, 2010 Non-Final Office Action, U.S. Appl. No. 11/405,083, filed in the PTO on May 12, 2010 (30 pages).

Jul. 21, 2010 Final Office Action, U.S. Appl. No. 11/405,083 (20 pages).

Response to Jul. 21, 2010 Non-Final Office Action, U.S. Appl. No. 11/405,083, filed in the PTO on Nov. 17, 2010 (16 pages).
Jan. 21, 2011 Non-Final Office Action, U.S. Appl. No. 12/245,349 (20 pages).
International Search Report from PCT application No. PCT US2006/014527 dated Apr. 10, 2007 (7 pages).
Written Opinion of the International Searching Authority from the International Search Report from PCT application No. PCT/US2006/014527 dated Apr. 10, 2007 (9 pages).
Elpida, 'Low Power Function of Mobile RAMTM Deep Power Down (DPD),' Elpida Memory, Inc. 2005-2006, Date Published May 2006 (K) Japan, URL: http:// www.elpida.com, pp. 1-4.
European Patent Office Communication from EPO application No. 07 861 460.9-2212 dated Mar. 23, 2010 (3 pages).
European Search Report from EPO application No. 08836238.92212/2201463 dated Sep. 14, 2010 (7 pages).
International Search Report for International Application No. PCT US2007/022316, dated Mar. 28, 2008, 3 pages.
May 28, 2010 Response to European Patent Office Communication from EPO application No. 07 861460.9-2212 dated Mar. 23, 2010 (17 pages).
Pharris, B., "The SCALE DRAM Subsystem," Massachusetts Institute of Technology, May 2004, pp. 1-79.
Response to Jul. 21, 2009 Non-Final Office Action, U.S. Appl. No. 11/405,083, filed in the PTO on Oct. 7, 2009.
Response to May 19, 2010 Non-Final Office Action, U.S. Appl. No. 11/975,269, filed in the PTO on Nov. 9, 2010, 7 pages.
Notice of Preliminary Rejection dated Jan. 24, 2011 from the Korean Intellectual Property Office (KIPO) for Korean Patent Application No. 10-2009-7008236, 2 pages.
Argument and Amendment filed on Mar. 21, 2011 in the Korean Intellectual Property Office (KIPO) for Korean Patent Application No. 10-2009-7008236, 9 pages.
European Patent Office Communication from EPO application No. 07 861 460.9-2212 dated Oct. 15, 2010 (5 pages).
Mar. 14, 2011 Response to European Patent Office Communication from EPO application No. 07 861 460.9-2212 dated Oct. 15, 2010 (13 pages).
US 6,832,284, 12/2004, Perego et al. (withdrawn)

* cited by examiner

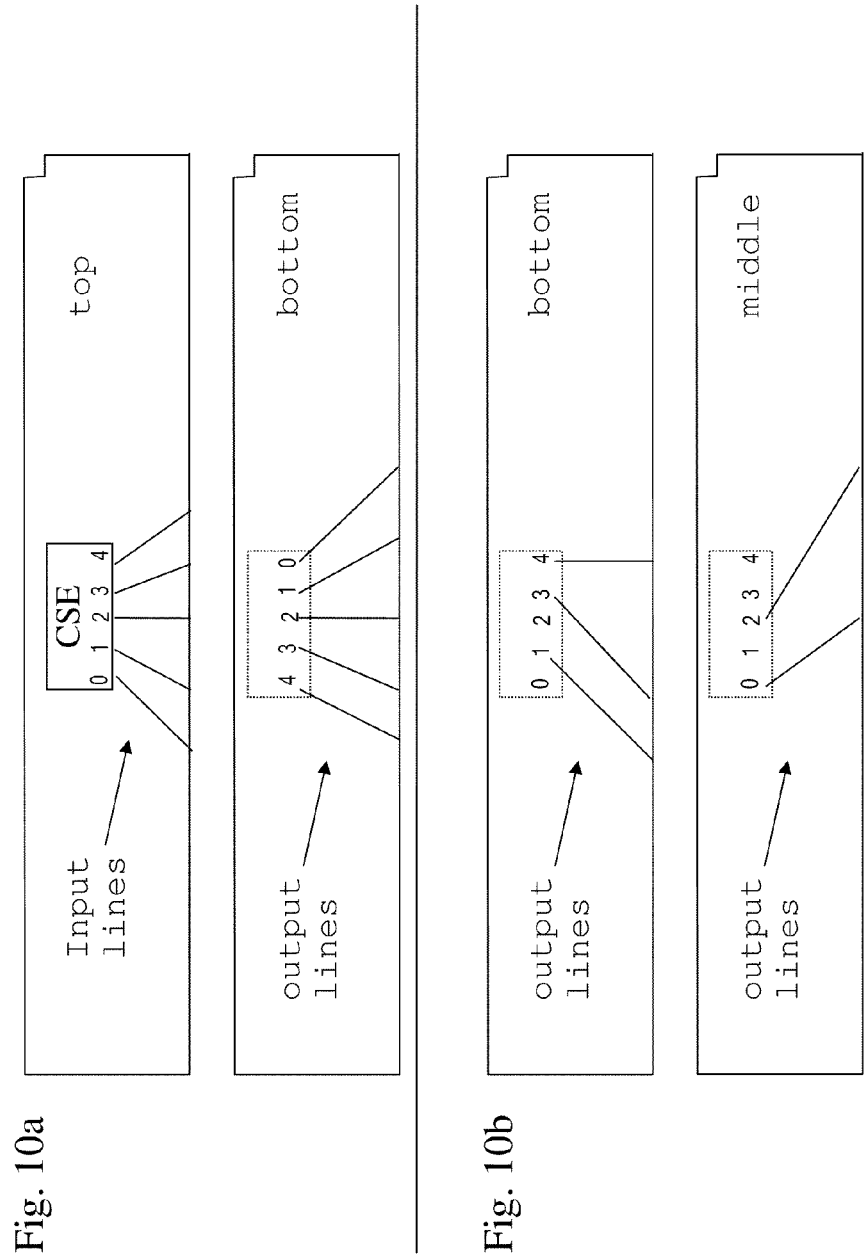

SKEW MANAGEMENT IN AN INTERCONNECTION SYSTEM

This application claims the benefit of U.S. provisional application Ser. No. 60/853,852, "Skew Management in an Interconnection System," filed on Oct. 23, 2006, the application being incorporated herein in its entirety by reference.

BACKGROUND

Generally, the evolution of computer and communications products has been governed by such principles as "Moore's Law", where both the density of the components increases, and the cost of such a component decreases with time. This has also often been accompanied by increases in transfer and computation speed. These trends have often increased the power dissipation density and required new solutions to either dissipate the heat or operate in the high temperature environment. In high speed circuits, both signal propagation delay and the design and manufacturing tolerances may place limitations on the realizable speeds attained in practice.

Contemporary memory system architectures may demonstrate tradeoffs between cost, performance and the ability to upgrade, for example; the total memory capacity of the system. Memory capacity is commonly upgraded via memory modules or cards having a connector/socket interface. Often these memory modules are connected to a bus or interconnecting wiring disposed on a backplane to utilize system resources efficiently. In addition to upgradeability, many of these contemporary memory systems also require high throughput for bandwidth intensive applications, such as graphics.

One popular type of memory module is a Dual In-line Memory Module (DIMM). The DIMM is a rectangular low-profile circuit board that has electrical contact points arranged on both sides along one long edge. The contact points form electrical connections to the main board memory bus when the DIMM is inserted into a DIMM memory socket.

Memories used in computing and communications systems include, but are not limited to, random access memory (RAM) of all types (e.g., S-RAM, D-RAM); programmable read only memory (PROM); electronically alterable read only memory (EPROM); flash memory, magnetic memories of all types including Magnetoresistive Random Access Memory (MRAM), Ferroelectric RAM (FRAM or FeRAM) as well as NRAM (Nanotube-based/Nonvolatile RAM) and Phase-change memory (PRAM), and magnetic disk storage media. Other memories which may become suitable for use in the future include quantum devices and the like.

At present, the size and performance of memory systems may be limited by power consumption, by cooling capacity associated with the power consumption and device density, by response time due to, for example, data skew, by the complexity of the circuit boards needed to interconnect the memory elements, and by the economic costs of these considerations.

This application is related to U.S. Ser. No. 11/405,083 "Interconnection System" by the same inventor, filed on Apr. 17, 2006, the application being incorporated herein in its entirety by reference.

SUMMARY

An interconnection system is disclosed, including a bus having a plurality of signal lines, each line capable of transmitting or receiving a signal comprising a data bit. A data bit on a first line and a data bit on a second line and are exchanged between signal lines an interval along the bus. In an aspect, the data is transmitted on three or more signal lines, and the data bits are exchanged such that the data bit having a first time delay is exchanged with the data bit having a second time delay. In another aspect, an exchange pattern of a first exchange pattern is used for each subsequent exchange.

An interconnection system is disclosed including a plurality of nodes, the nodes forming a network connected by links having a plurality of lines, and motherboard having a connector for interfacing with a node of the plurality of nodes. A first node is a source of data, and a second node is a destination of data, and at least one of the first node or the second node is configurable to change the assignment of data between lines. In an aspect, the data is transmitted on three or more signal lines, and data bits of the data are exchanged such that a data bit on a line having a larger cumulative time delay is exchanged with a data bit on a line having a smaller cumulative time delay.

A node of an interconnection system includes a switch, an input port and an output port, each port having first, second, third and fourth lines. The first line of the input port is connected to the second line of the output port, and the third line of the input port is connectable to one of the first, third or fourth lines of the output port. In an aspect the second line of the input port is connected to the first line of the output port. In another aspect, the third line of the input port is connectable to one of the third or fourth lines of the output port.

A module includes a connectorized circuit card, having a connector with multiple connectable elements and an electronic circuit module having input connections and output connections communicating with connectable elements of the connector. An input connection and an output connection are disposed so that the difference in transmission delay between pairs of input connectable elements and output connectable elements is reduced.

A method of compensating for data skew in an interconnection includes providing a signal bus having a plurality of lines, connecting a plurality of nodes to the signal bus; determining differential time delays for signal transmission between adjacent connected nodes on the bus; and interchanging data lanes between lines so as to change a time delay difference for data between at least a pair of the lines of the bus when measured at a destination mode.

A method for compensating for data skew in an interconnection system includes providing a node connectable to a signal bus, the node comprising at least a switch and configuring the switch such that at least a first input line is connected to other than a first output line. In an aspect, at least one path is provided as a fixed connection between the first input line and other than the first output line.

A software program product, stored on a machine readable medium, includes instructions configuring an electronic device to determine a differential time delay for signal transmission between connected nodes on a bus; and to configure the assignment of data lanes between lines of the bus so as to change a time delay difference for data between at least a pair of lines of the bus when measured at a subsequent node.

BRIEF DESCRIPTION OF THE DRAWINGS

FIGS. 10 (a) and (b) shows a connectorized circuit board with a form factor similar to that of DIMM and where the input and output lines are physically arranged to reduce the differential skew due to differential line length;

DETAILED DESCRIPTION

Figure 1:
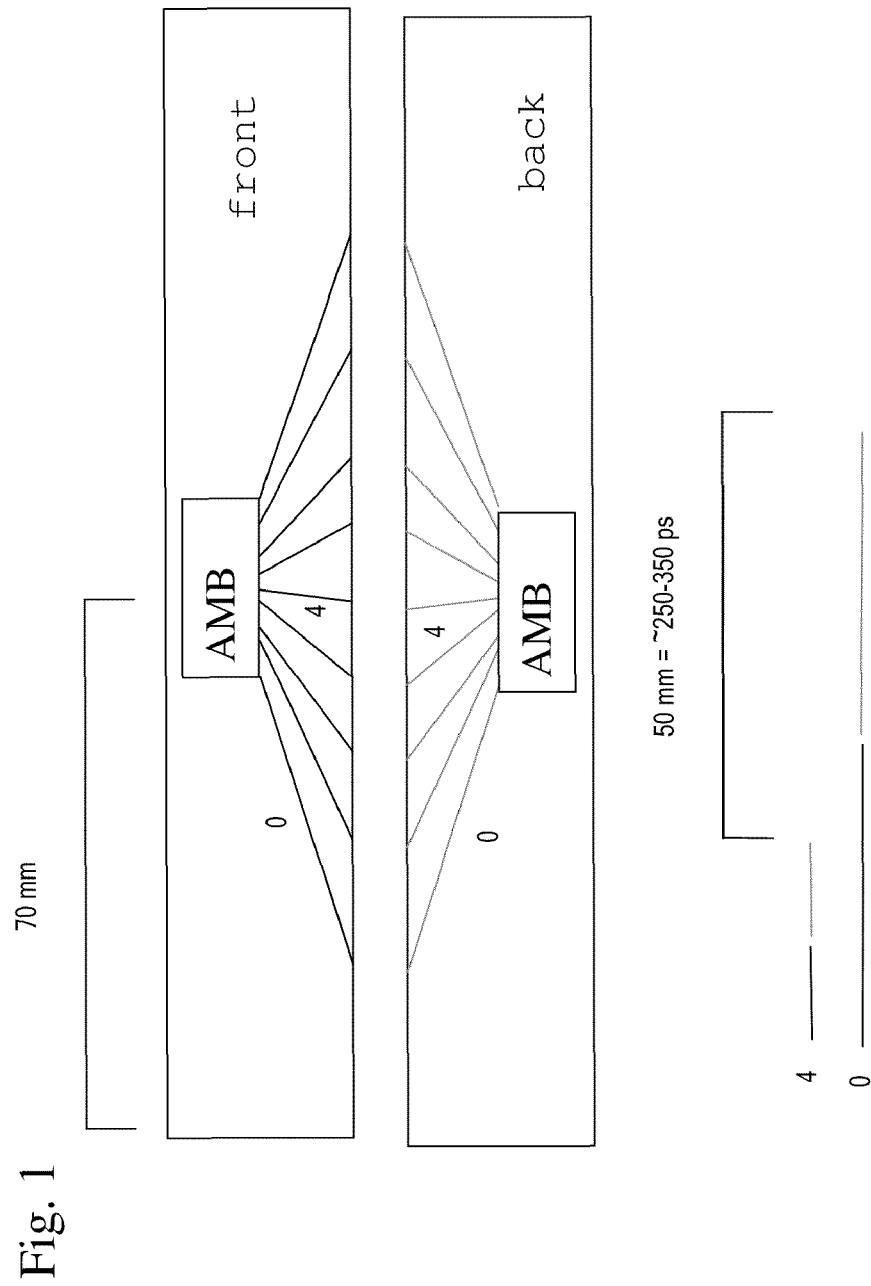
FIG. 1 is an elevation profile of the front and back sides of a connectorized module with dimensions similar to that of a dual in-line memory module (DIMM), showing trace lengths.

Exemplary embodiments may be better understood with reference to the drawings, but these embodiments are not intended to be of a limiting nature. Like numbered elements in the same or different drawings perform equivalent functions. Elements may be either numbered or designated by acronyms, or both, and the choice between the representation is made merely for clarity, so that an element designated by a numeral, and the same element designated by an acronym or alphanumeric indicator should not be distinguished on that basis.

It will be appreciated that the methods described and the apparatus shown in the figures may be configured or embodied in machine-executable instructions and electronic components; e.g., software, hardware, or in a combination of both. The instructions can be used to cause a general-purpose computer, a special-purpose processor, such as a DSP or array processor, or the like, that is programmed with the instructions to perform the operations described. Alternatively, the operations might be performed by specific hardware components that contain hardwired logic or firmware instructions for performing the operations described, or which may be configured to so, or by any combination of programmed computer components and custom hardware components, which may include analog circuits.

The methods may be provided, at least in part, as a computer program product that may include a machine-readable medium having stored thereon instructions which may be used to program a computer (or other electronic devices, such as a field programmable gate array (FPGA), or the like) to perform the methods. For the purposes of this specification, the terms "machine-readable medium" shall be taken to include any medium that is capable of storing or encoding a sequence of instructions or data for execution by a computing machine or special-purpose hardware and that cause the machine or special purpose hardware to perform any one of the methodologies or functions of the present invention. The term "machine-readable medium" shall accordingly be taken include, but not be limited to, solid-state memories, optical and magnetic disks, magnetic memories, optical memories, and carrier wave signals. The software may be stored or distributed on one medium and transferred or re-stored on another medium for use.

For example, but not by way of limitation, a machine readable medium may include read-only memory (ROM); random access memory (RAM) of all types (e.g., S-RAM, D-RAM); programmable read only memory (PROM); electronically alterable read only memory (EPROM); magnetic random access memory; magnetic disk storage media; flash memory; electrical, optical, acoustical or other forms of propagated signals (e.g., carrier waves, infrared signals, or digital signals).

Furthermore, it is common in the art to speak of software, in one form or another (e.g., program, procedure, process, application, module, algorithm or logic), as taking an action or causing a result. Such expressions are merely a convenient way of saying that execution of the software by a computer or equivalent device, such as a FPGA, causes or configures the processor of the computer or the equivalent device to perform an action or a produce a result, as is well known by persons skilled in the art.

When describing a particular example, the example may include a particular feature, structure, or characteristic, but every example may not necessarily include the particular feature, structure or characteristic. This should not be taken as a suggestion or implication that the features, structure or characteristics of two or more examples should not or could not be combined, except when such a combination is explicitly excluded. When a particular feature, structure, or characteristic is described in connection with an example, such feature, structure, or characteristic may be used in connection with other examples, whether or not explicitly described.

A connector or connector interface as described herein, such as a memory module connector interface, is not limited to physically separable interfaces where a male connector or interface engages a female connector or interface. A connector interface also includes any type of physical interface or connection, such as an interface where leads, solder balls or connections from a memory module, a switch or the like, are soldered to a circuit board. For example, in a stacked die approach, a number of integrated circuit die (e.g., memory devices and buffer devices) may be stacked on top of one another with a substrate forming the base and interface to a memory controller or processor through, for example, a ball grid array type of connector interface. As another example, a memory, switch or buffer device may be interconnected via a flexible tape interconnect and interface to a memory controller through one of a ball grid array type connector interface or a physically separable socket type connector interface. Connection types may include the interface between integrated circuit chips, interconnection conductors on a substrate, between substrates, or on printed circuit boards, or the like.

A node may include memory and may also have a controller for the memory, a configurable switching element (CSE) and other circuitry for processing, transmitting or receiving signals. However a module may include the memory, and one or more of the other elements may be separately mounted. Alternatively, the module may include the CSE and one or more of the other elements may be separately mounted. Except as specifically mentioned herein, the allocation of the functions to specific modules is intended for convenience in discussion, as a person of skill in the art will appreciate that the actual physical aspects and computational aspects may be arranged in a variety of equivalent ways.

"Bus" or "link" means a signal line or a plurality of signal lines, each having one or more connection points for "transceiving" (i.e., either transmitting, receiving or both). Each connection point may connect to couple to, or to communicate with a transceiver (i.e., a transmitter-receiver) or one of a single transmitter or receiver circuit. A connection or coupling is provided electrically, optically, magnetically, by way of quantum entanglement or equivalents thereof. Other electrical connections, by the same or similar means are used to provide for satisfaction of such additional system requirements as power, ground, auxiliary signaling and control, or the like. Such additional connections are occasionally described so as to clarify the description, however such additional connections are well known to persons skilled in the art, and the lack of description of these connections in any example should not be taken to exclude their inclusion.

A link carries signals on a signal lines. Signals fall generally into any of several categories including clock and control signals, address signals, command signals, and data signals. Data signals carry data that may be stored in, or retrieved from, a memory device or interface. Address signals specify the location or range of locations within a memory device or system where data is to be read from or written to, and may also select which of one or a plurality of memory devices or interfaces is to be accessed. Command signals instruct a memory device or interface as to what type of operation is to be performed, e.g., read, write, refresh, or access mode (such as a burst or broadcast mode) should be used for a data transfer. Clock and control signals synchronize the other signals passing between controller and the memory devices. Although a link may use a separate signal line for each signal (e.g., 32 address lines to transfer a 32-bit-wide address in one clock cycle and 32 data lines to transfer a 32-bit-wide data word in one clock cycle), various schemes also exist to re-use one or more signal lines for different signals, various schemes also exist to re-use one or more signal lines for command signals, control signals, address signals, or data signals during different clock cycles of a memory transaction.

It should be appreciated that when lines are discussed as being connected to an interface or to a port, it is convenient to describe the lines as being active, being powered on or powered off, being in standby mode, or the like. This is meant to be interpreted as referring to the status of the connection at an interface with a port at a node, and may include other node functions. The lines themselves may be merely metallic traces on a circuit board, or the like, serving to provide connections between nodes.

The use of the term "line" herein to refer to a physical line, which may have data logically assigned thereto, differs somewhat from the pervious usage in U.S. Ser. No. 11/405,083, where the terms line and lane were often used interchangeably. Whether the term lane was meant to be interpreted as being a physical object, now called a line, or, alternatively, a logical construct associated with a data word or data bit, was understandable from the contextual usage of that specification. Herein, and for future use, but not retrospectively, the term lane will connote a logical concept associated with data. A lane of data may be associated with the physical line on which the data travels as signals between nodes or other electronic components, which may be both active and passive components. As such, the lane may be said to be bound to a line when the data of a lane is transmitted as a signal on a line. The binding of the lane to a line may change so that the lane may be reassigned to another line. Similarly, the term bus or link may now be called a channel, and whether the terms refer to a collection of logical lanes or to a collection of the lines will be apparent from the context.

Figure 3:
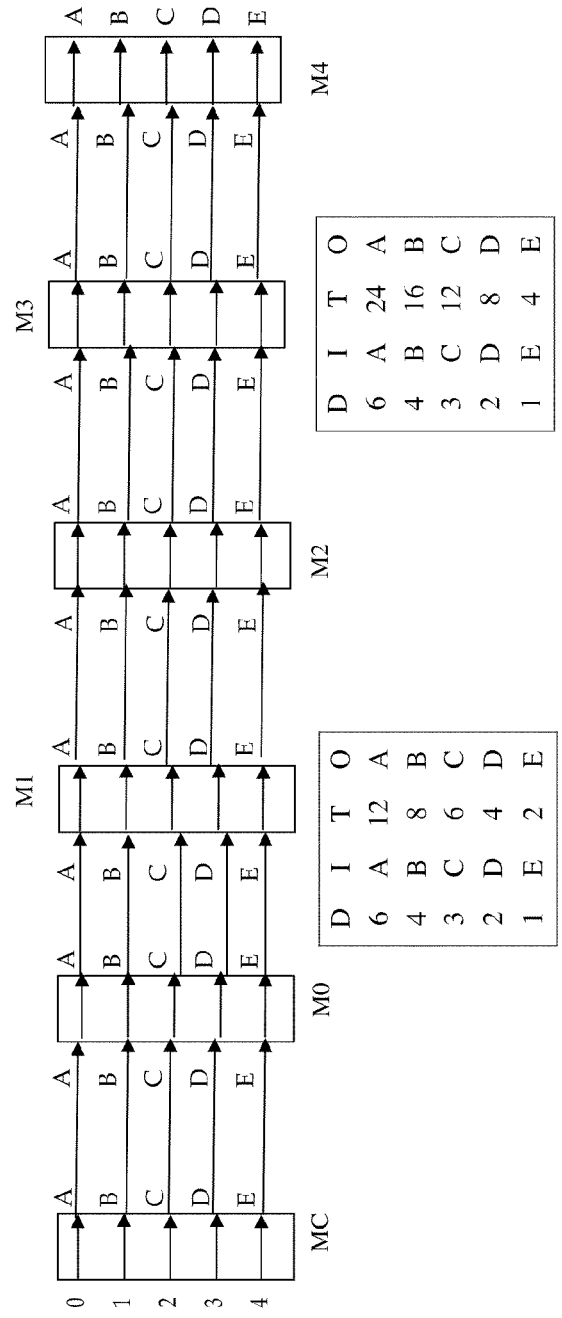
FIG. 3 shows a linear arrangement of nodes connected to a bus, where the binding of the lanes to the lines is such that the data on an input line is the same as the data on the corresponding output line.
Figure 4:
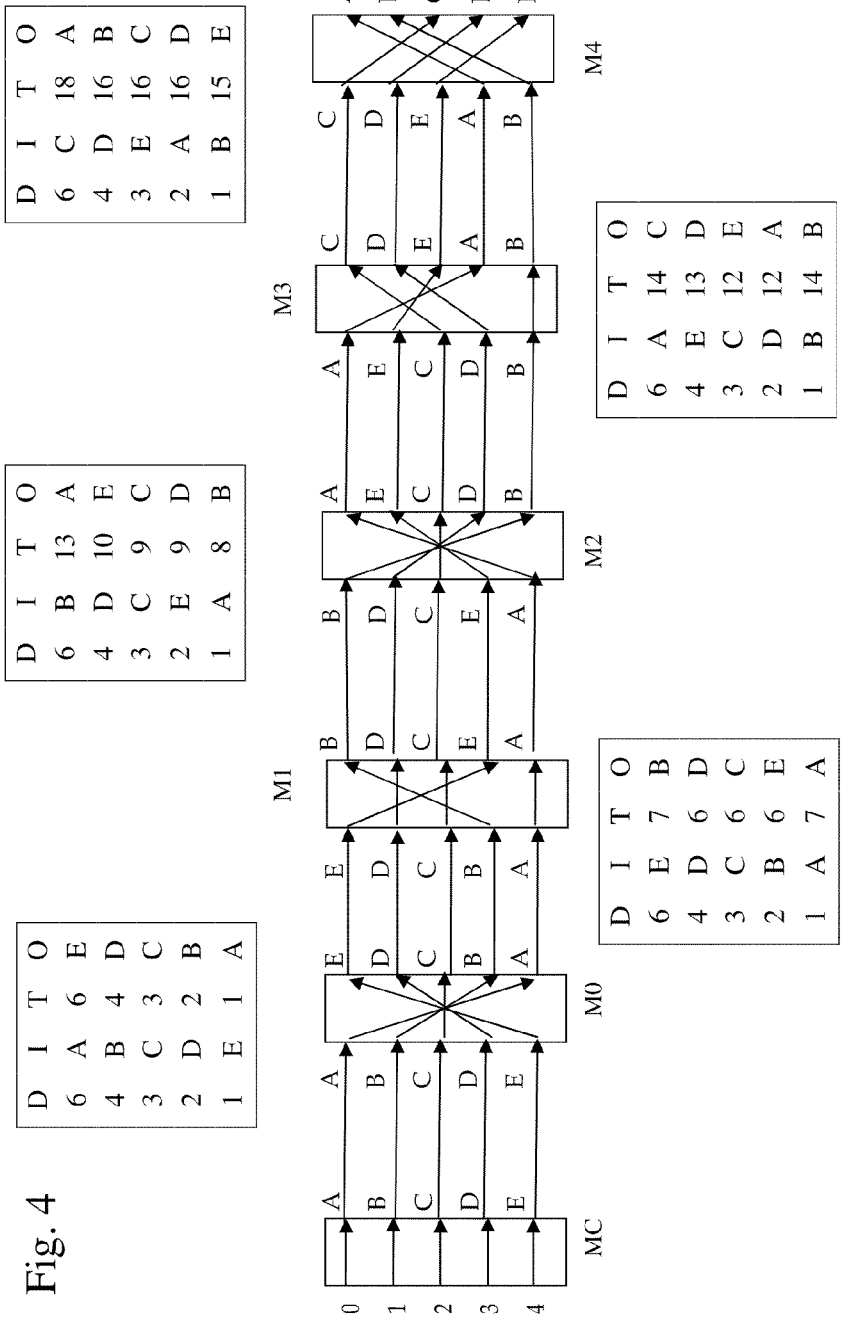
FIG. 4 shows a linear arrangement of nodes connected to a bus showing the binding of the lanes to the lines, and configured so as to reduce the skew when measured at a destination node.

The terms lane and line, as now used, may be understood with reference to FIG. 3. There are 5 lines, being electronic in nature and carrying signals, which are numbered 0 through 4. There are a corresponding set of logical data assignments labeled A through E. In the example of FIG. 3, the binding of a logical data set to the physical lines remains the same at each of the nodes. However, FIG. 4 shows an example where the binding of the logical data to the physical lines changes at one or more nodes.

A "breadth-first" convention is often used in numbering the nodes in a tree; that is, to start at a root of the tree and work across all the elements at a given level before moving on to the next level. This numbering is for convenience only. For implementation purposes many different numbering schemes might be used, including two or more numbering schemes simultaneously. For signaling purposes the convention "port 0", "port 1", or "port A" or "port B" may refer to relative rather than absolute ports. By convention, "southbound", "downstream" or "secondary" refers to the direction heading away from a module controller or root while "northbound", "upstream" or "primary" refers to the direction heading towards the module controller or root. There may be more that one root or module controller, and each of them may be operable contemporaneously.

An additional consideration is the time dispersal of the data bits in each data word, packet or frame. In many links, the bits of the data may be sent on in parallel on lines. It should be understood that this may a simplification of the actual situation, as the data may be sent over parallel lines with more than one bit of a data word transmitted on each line in a serial fashion, as an example. Due to differential delays of the signals on the lines, the differential delays being associated with, amongst other factors, line length, impedance, electronic bandwidth, and the like, the signals representing data bits may not arrive with sufficient simultaneity for immediate processing and it may be necessary to wait or buffer the data for one or more clock cycles or data frames, until all of the bits have been received by a module or node in order to proceed with decoding or other data processing. This delay further increases the time necessary at each node before the address, or other information, can be acted upon. In such a circumstance, and where it may be desired to turn on the lines of links only as they are required for data transmission (where transmission is generally understood to include reception), the address information may have to be sent a period of time in advance of the associated command or data. This may have the effect of reducing the system transfer capacity or bandwidth.

The effective physical lengths of the individual lines in a link may generally be different, and there may be a time difference in the time of arrival of bits sent on different transmission lines. This may be termed data "skew". One method of accommodating data skew is to perform de-skew at each hop such that the header of a data packet may be interpreted and the packet transmitted on the next hop. However, this may add significant latency time to the re-transmission, as the de-skew process may require at least as much time as the longest differential delay between lines between each node. Other approaches attempt to avoid this additional delay by not performing de-skew at each node, but to perform the de-skew at the receiver of the addressed module or node, while allowing the skew to build up along the path. But, the cumulative delay can also add significant total delay, as the differential delay accumulated from the source (e.g., a memory controller) to the destination node may need to be accommodated, even though part of the data packet may have arrived earlier.

In the FB-DIMM technology as being developed by INTEL, devices are believed to be required to be able to correct for a skew of up to six UI per hop. The term "UI" or "Unit Interval", which is the average time interval between transitions of a signal, may be used at high clock rates in place of a clock period, as the clock period may not be completely stable or free of jitter. If six UI of skew per hop is expected, and a memory system has 8 hops, the total skew is 48 UI.

In the case of a link running at a clock speed of nominally 2 GHz with a data rate of 4 Gbps, 1 UI=250 picoseconds (ps) so a delay skew of 48 UI is the equivalent of 12 nanoseconds (ns) of skew. That is, it is assumed that 12 ns is needed between the first arriving bit on one line and the last arriving bit on one of the other lines. The first arriving bits may need to be stored in memories, latches or shift registers, or the like, until such time as the later arriving bits arrive, and then the bits are presented to the device which is to de-skew and read the data.

Among the causes of skew is the situation shown in FIG. 1 where an INTEL Advanced Memory Buffer (AMB), or the like, is in a module which is disposed on an connectorized board that may be inserted into a connector mounted on, for example, a motherboard. The term "AMB" is used as an example of an on-board memory interface or controller. Such arrangements may be used for FB-DIMM, registered DIMM, and the like. The message on the upstream path from a downstream module has a number of lines, where lane 0 is on the left, line 4 is in the middle, and so on. The upstream path may interface with a front side of the connector and, after passing through the AMB, may connect to a similar arrangement of lines on the back side of the connector. Note that while the AMB is shown on a front side and back side of the plug-in board, separate AMB elements are not required to perform this function. Additionally while the lines are shown only to the edge of the AMB, they may connect underneath the AMB if the AMB is in a ball grid array (BGA) package or other package which allows connections not only at the edge thereof. The lines emerge from the AMB to a connector on the back side of the board. The lines on the back side of the board are also disposed such that line 0 is on the left and line 4 is in the center, and so on. The lines shown may be considered to represent traces on the board for connecting between the AMB and the board interface connector (not shown). The lines are disposed as shown so that more than one module can be connected by a motherboard with traces connecting the mating module interface connectors. In this aspect, the time for signals to propagate between the pins of successive connectors on a motherboard may be approximately the same for each line. However, this is not the situation on the module board. Line 4 has a short distance to travel from the connector to the AMB, whereas, for example, line 0 has a larger distance.

For illustrative purposes, a standard size DIMM module is used as a reference. Such modules are about 140 mm in width, and therefore, the distance to lane 0 from the center, where the switch is located, is about 70 mm. Attributing a length of 20 mm to the length of line 4 between the AMB and a corresponding pin on the connector, the maximum differential length, in this example, between the shortest and longest traces is about 50 mm, which corresponds to an approximate difference in propagation time of about 250-350 ps. This represents the estimated situation with an existing DIMM. Where the data rate is nominally 4 GB/s, this may result in one or two clock periods of skew from this effect alone.

While several standardized DIMM or memory modules exist, the term DIMM or memory module as used herein should be understood to refer to any of the memory types which may be used as mounted to a circuit board having a connector interface for connection to other modules circuits and the like. The number of pins or traces, the dimensions of the circuit board, and the capacity and type or types of memory on the DIMM or memory modules are not restricted to such pin counts, interconnect counts, dimensions, types and capacities as are now being produced or used.

Figures 2A, 2B:
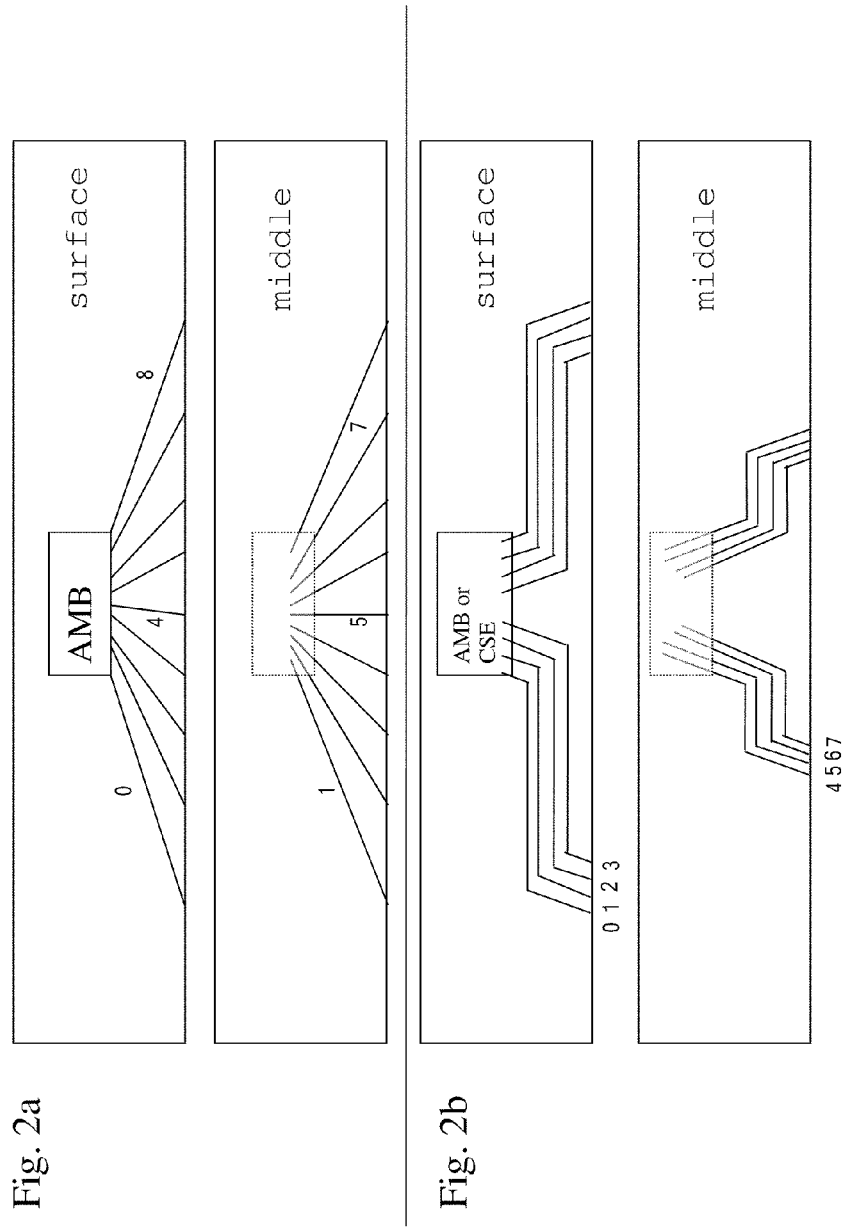
FIG. 2 (*a*) shows a means of reducing the skew due to differing line lengths; and (b) shows an alternate means of reducing skew.

FIGS. 2 *a, b* show how different approaches to signal routing may be used to mitigate the differential propagation time problem. FIG. 2*a* shows a situation where the traces are fanned out directly from the CSE, or other device, which may be an AMB, to the connector. FIG. 2*b* shows a situation where the signal lines with longer traces are routed on the opposing ends of the board and then another set of signal lines are routed from the middle. In such a circumstance, the propagation distances for some traces are greater than in FIG. 2*a*, however the difference in trace length between groups of signals, such as between 0, 1, 2 and 3, or between 4, 5, 6 and 7 can be reduced. While there may still be a difference between in length between groups of traces, the process of delay management and signal de-skew may be simplified by reducing the delay variation from, N different delays for N signals to 2 different approximately equal delays in the example of FIG. 2*b*.

FIG. 3 shows an example of transmission from a module controller MC, shown at the left-hand-side of the figure through five modules, for lines 0-4. The data being transmitted from the MC has been designated as A, B, C, D, and E, corresponding to the input data lanes. At each of the downstream modules a table shows the logical name of the input "I", the delay "D" experienced by the data on that line, the total delay "T" from the MC to the present position along the data transmission path and the logical name of the output data "O". The rows of the table correspond to the order of the lines; thus the upper row shows line 0 and the bottom row shows line 4. In this example, a delay is associated with each line, and the delay may be different for each line. The delay may be interpreted as a differential delay with respect to a notional line with no excess delay or of the delay from the transmitter on the previous module, or the MC, to the receiver on the receiving module.

For this example, where the delay between modules is presumed to range from 1-6 (arbitrary units) for illustrative purposes, and the input and the output lines from each module have the same data assigned or bound at the output of a given line number as that which arrived on the input, the output data pattern associated with each module is the same as the input data pattern: A, B, C, D, and E associated with lines 0-4 respectively. By following the progression of the tables from module-to-module in the downstream direction, the total delay for each line is seen to be the sum of the delays for that line between the MC and the module which is associated with the table. For example, the total delay experienced between the MC and the 5th module (M4) is 30 units for line 0, but only 5 units for lane 4. The other lines, in this example, experience intermediate amounts of time delay. If the delay units were associated with clock cycles, then the data on line 0 would arrive 25 clock cycles behind that for line 4.

The delay time values are given as integer values and which are the same in a given line between each of the modules are for illustrative purposes only. The delays need not be integer valued nor must they be the same at each hop between modules.

In this example, if the total length of the command, or data packet, or frame, being sent was, for example, 10 clock cycles, then about 2.5 commands would be in the process of being received at any time by module M4. Thus the last module may need to buffer more than two complete commands at any time before it could process the first command, as all of the bits of the first command will take this long to be received as a complete group. In this example, the second command and part of the third command will have begun to have been received at module M4 before all of the bits of the first command will have been received.

FIG. 4 illustrates a device and method for reducing the differential delay between the data lanes, so that the accumulation of skew in a system may be mitigated, and the number of commands that may need to be contemporaneously processed at each node or hop may be reduced. In this device, the input data to each module may be output to a different line from the input line, with respect to the layout on the plug-in module or the circuit board or substrate. The actual physical arrangement of the lines is the same as in FIG. 3 for purposes of the example of FIG. 4. The example is meant to illustrate some of the differences between the performance of the existing AMB or similar system where the data lanes remain assigned or bound to the same lines at each module, as previously described, and the method and apparatus of the present application. In some instances, the input and output data lines have the same logical lane assignment as previously, so that only some of the data may exit on a different line.

For example, at the first module (M0), the data lane A that came in on line 0 is output on line 4; the data lane B that came in on line 1 is output on line 3; the data lane D that came in on line 3 is output on line 1; the data lane E that came in on line 4 is output on line 0; and, the data lane C that came in on line 2 is output on line 2.

At the output of module M1, the differential delay situation is the same as shown for module M1 in FIG. 3. However, when considering the table for module M2, the situation has changed. As an example, the data lane A, which is now on line 4 for the transit between modules M1 and M 2, has only accumulated the delay associated with line 4, which is 1 unit; and, the data lane E, which is now on line 0, accumulated the delay associated with line 0. At the second module M2, it is seen that the delay for the data lane E is 7 units and the delay for the data lane A is also 7 units. Delays for the other data lanes B, C, D may not be exactly the same, but are close in value, and the re-assignment of data lanes and physical lines has reduced the spread in delays.

Following the reassignment or exchanging of the data lanes A-E to lines 0-4 at each module, the difference in delay between the various data lane assignments A-E is seen to accumulate monotonically, as in the previous example. The data lanes may continue to be exchanged to an appropriate line at each module. At the last module (in this example M4), the associated table shows that the range of delays associated with the various data lanes elements ranges from 15 units to 18 units, for a total delay spread of 3. This may be compared with the example of FIG. 3, where the delay spread was 25. Interchanging the correspondence between the logical data lane assignments and the physical lines in the example shown may thus reduce the amount of data which may need to be buffered before all of the data for a given frame at the transmitter (such as a memory controller) has been received at a module by about a factor of 8. In this example, the lanes or data bits are reordered in module M4 into the same logical arrangement as were transmitted. In an alternative, the lanes or data bits may be rearranged at the memory controller or other transmitting end so that the reordering at the receiving end may not be needed.

The bit assignment strategy used in the example was to select the data which had experienced the highest accumulated time delay and assign it as an output to the line having the lowest accumulated time delay. Similarly, the data with the lowest accumulated time delay is assigned to the line with the highest accumulated time delay. Other strategies may also be used, where the differential skew may be increased, decreased, or remain the same when measured at a particular location in the system.

In the description, the delays are given integer values for simplicity of presentation; however non-integer values are also possible as the time delay is stated in arbitrary units representing some multiple of the clock rate. Alternatively, the time delay and differential time delay may be expressed in integer and fractional clock durations.

The time delays are shown as having been previously determined, as the basis for the setting strategy and configuration of the lane-to-line-swapping switches. Such a determination may be made at the time of system design or prototyping, the time of manufacture, the time of assembly of the modules into a system, system start up, each system start up, or by measurements made during the operation of the system. The selection of the time or times to perform this determination may be associated with the desired performance and the complexity of the system, and may take into account manufacturing variability and temperature effects, as well as active or passive component failure or degradation.

The function of interchanging exchanging, swapping, re-assigning, or binding of lanes to lines may be performed by a switch, however the use of the term "switch" does not serve to limit the specific implementation of the function to a discrete device; any mechanism that achieves the interchanging, exchanging, re-assignment, swapping, or binding of the lanes may be used. For convenience, the term "switch" when applied to this aspect of the system, apparatus, or method is meant to encompass the range of techniques which are available to perform the function. Such techniques may use memory storage locations, operation of a state machine or a stored program computer, and dedicated electronic logic circuits and the like, either alone on in combination. Such switching may be performed on a static or a dynamic basis, depending on the design requirements of a specific product. The term switch may also include the swapping of lines using fixed connections or traces, which may include fusible links or other techniques which have an equivalent result.

Figure 5A:
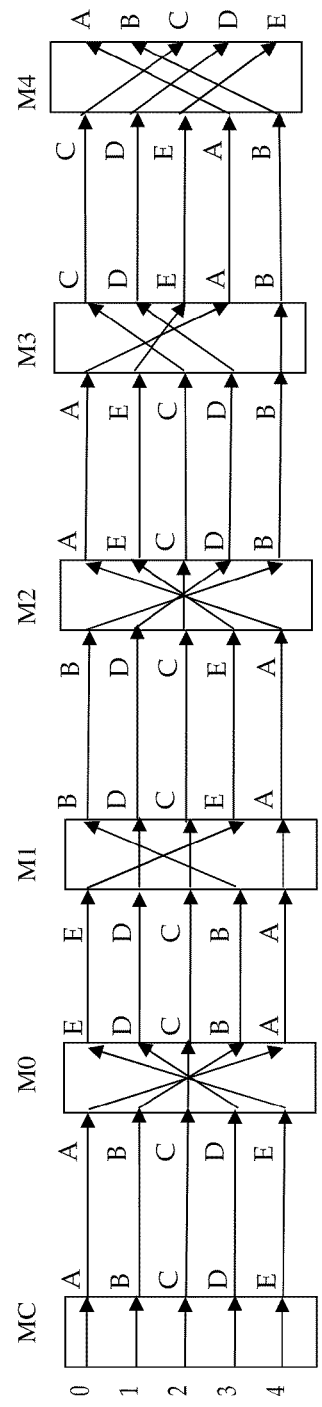
FIGS. 5 (a) repeats FIG. 4, and (b) and (c) illustrate that the data lanes may be bound to the lines either at the source or destination node, so as to achieve the same differential skew on the data path.

FIG. 5a shows a pattern of exchanging the data lanes between the lines in order to minimize the differential data time delay at any module. The tables of time delays are not shown, but are presumed to have led to the pattern of swapping that is shown. At M4, the data lanes arrive in a swapped order C, D, E, A, B, whereas the expected order is A, B, C, D, E and this order is restored by swapping the data appropriately inside module M4 such that the data is presented to the remainder of the system in the expected order.

Figure 5C:
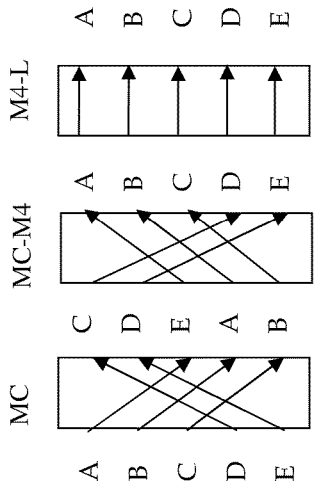
Figure 5B:
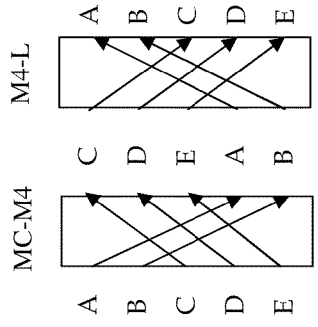

FIG. 5b summarizes the overall effect of the swapping as seen from the output of MC to the input of M4 and within M4. That is, the intermediate hops, and the swapping that occurs at each hop may be logically replaced by a single swapping of lanes from MC to M4 and a swapping of lanes inside M4. This represents the end-to-end transformation that obtains. The configuration of the switches at each module is as shown in FIG. 5a, and the ordering of the data at the MC is such that the arrangement is achieved at M4. In another aspect, shown in FIG. 5c, the switch arrangement remains unchanged but the order of the assignment of the data to the lanes is pre-permuted at the MC prior to transmission such that it is received at M4 in the expected sequence and no reordering is required in M4. Such an approach may minimize the time delay in processing at each module, and when the process is performed in the MC, the pre-permutation may be done while the commands and data are still in an output queue and the time to perform the operations may be subsumed in other system processes. Such pre-permutation may also to simplify the data path within the CSE by allowing incoming data to either be permuted for transmission to the next module or to be read without permutation for use by the local CSE. If the CSEs have been arranged in a branching configuration such as a tree which may be a binary or higher order tree, then a large fraction of the CSEs in the system may be leafs and have no other CSEs downstream from the leafs. The pre-permutation may be made in a static or dynamic manner.

The situations illustrated are directed to a MC to module transfer, but may be effectively used for other paths, such as DMA transfers between modules, and for different channels or branches of a tree. While the discussion has addressed the path from a MC, for example to a module, these operations may be equally performed in the reverse direction. That is, for example, while the discussion has addressed a southbound direction, the northbound direction may be similarly described.

Figure 6:
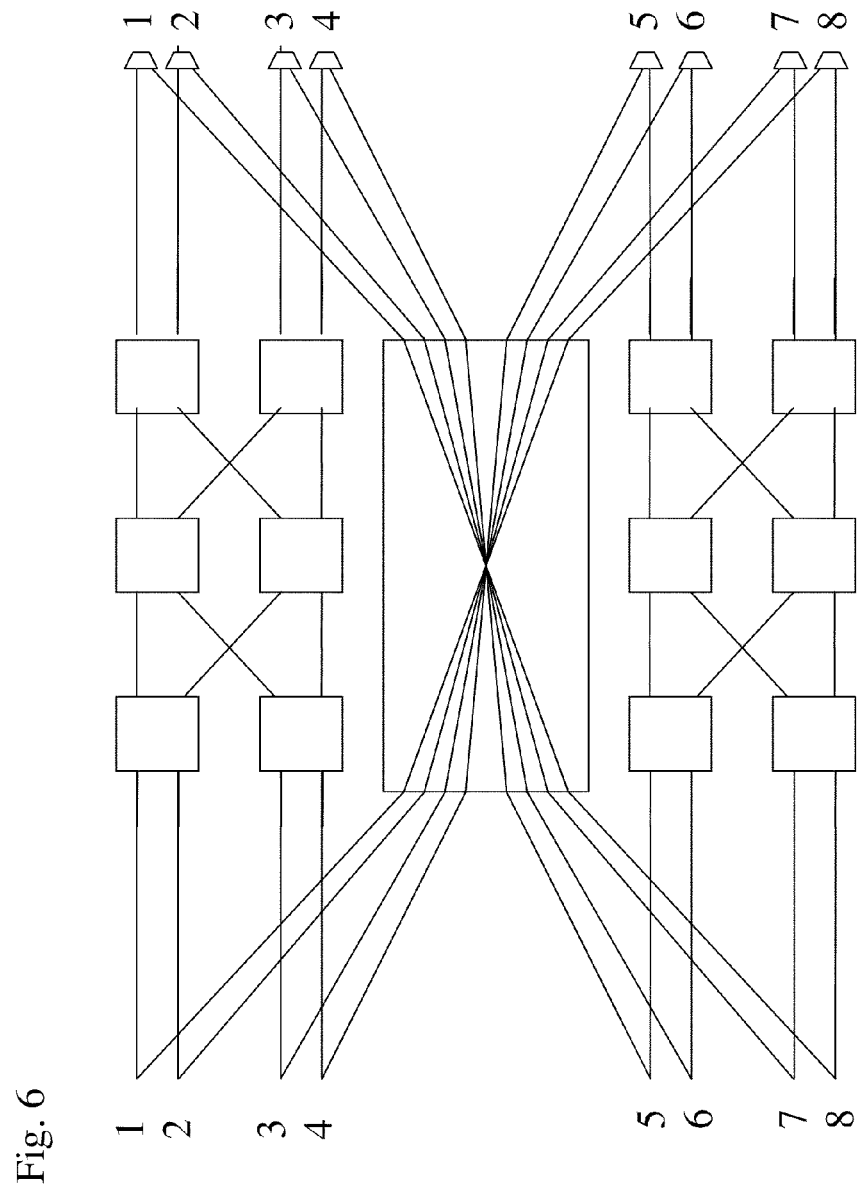
FIG. 6 illustrates a switch configuration having a fixed network for swapping data symmetrically between input and output lines, and a partially switchable network which may be selected by 2:1 multiplexers.

In some arrangements, it may be found that one or more patterns of lane interchange are frequently encountered. FIG. 6 illustrates a situation where a full swap may be a common occurrence for some lanes of a system, and is shown with a fixed circuit element connecting between, for example, input line 1 and the multiplexer that outputs to output line 8. The other inputs and outputs are connected similarly. Also shown are two Benes networks connecting the inputs and inputs to the output multiplexers such that other swapping arrangements may also be configured. The permutations desired are then selected by the output multiplexers in combination with the fixed network and variable configuration switches. While only one fixed network is shown, more than one fixed network may be used with multiplexers having greater input capacity, such as a 3 to 1 multiplexer. As may be done for many of the circuits being described, the circuits not being used may be powered down or powered off, or have their clocks, if any, gated, or any other steps which might be desirably taken to minimize power consumption.

Figure 7:
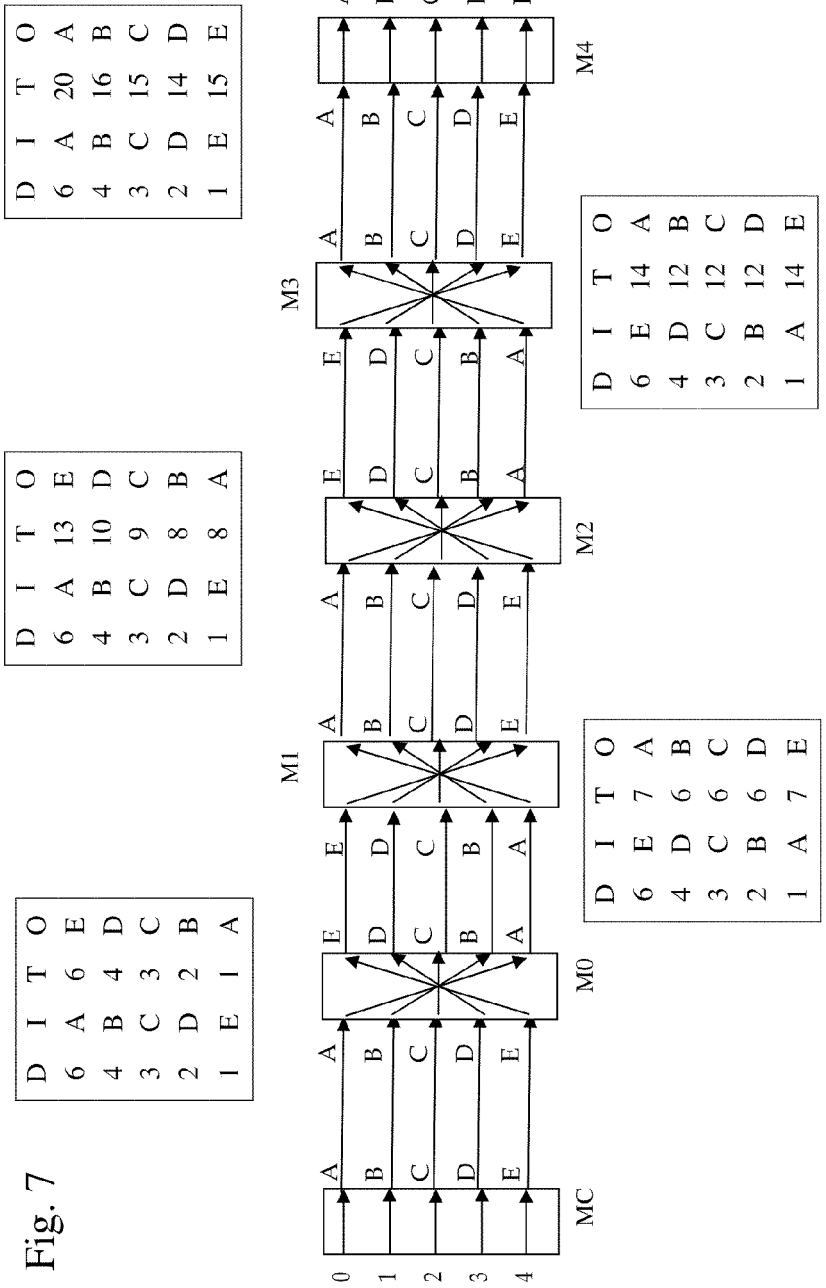
FIG. 7 illustrates a linear arrangement of nodes where the fixed network of FIG. 6 is used at each of the nodes.

FIG. 7 illustrates a bus arrangement where southbound transmission is between a memory controller MC and a memory module M4, and the signals pass through memory modules M0 through M3. For simplicity, the same values for delays are used as in the previous examples. At each of the memory modules, the delay D, the total delay T, and the input I and output O logical data assignments are shown. In each module M, an input line which may represented, for example, by a pin on a connector, is connected to an output line through a permutation which may be represented as shown and which may be by a fixed arrangement of connecting traces, or connections in chip, or a static or dynamic semiconductor switch or the like. The permutation connects an input line to an output line such that a swap of inputs and outputs is made symmetrically with respect to the arrangement of lines. Whether such axis of symmetry coincides with a line depends on whether an odd or even number of lines is being used. This should be understood to represent a conceptual description and not be interpreted to require an actual physical arrangement. It should be reiterated that the assignment of numerical values to the delay associated with each line is for purposes of example, and not to suggest any limitation of the values that may be assigned, or any sequence of association of time delay values with line number.

For some applications, the fixed exchange of lines may be sufficient to result in an acceptable total delay and differential skew. If the lines were not exchanged in this example, then the total delay of line 1 would be 30, and the total delay of line 4 would be 5, for a differential delay of 25. However, from FIG. 7, the total delay of the lane originally input to line 1 is 20, and the minimum delay of any other lane is 14, for a maximum differential time delay (data lane skew) of 6.

The input data representation at the MC, ABCDE, is replicated at the input M4. This results means that the bus length may be extended indefinitely and while the total delay will increase such that the total delay is doubled for double the bus length, and the maximum differential delay experienced at any periodic point along the bus may also double, and the pattern repeats.

The effect of time delays within a semiconductor device such as a AMB or CSE, or the like, are not shown in these examples, and a person of ordinary skill the art would consider the effect of such time delays, and any variability in time delay in the design of a system, node, or module. The use of physical connections or fixed switch connections to realize fixed permutations may reduce any additional time delays. The physical connections may be traces, be fusible links, or be any other technique of construction that achieves the same aim.

Figure 8:
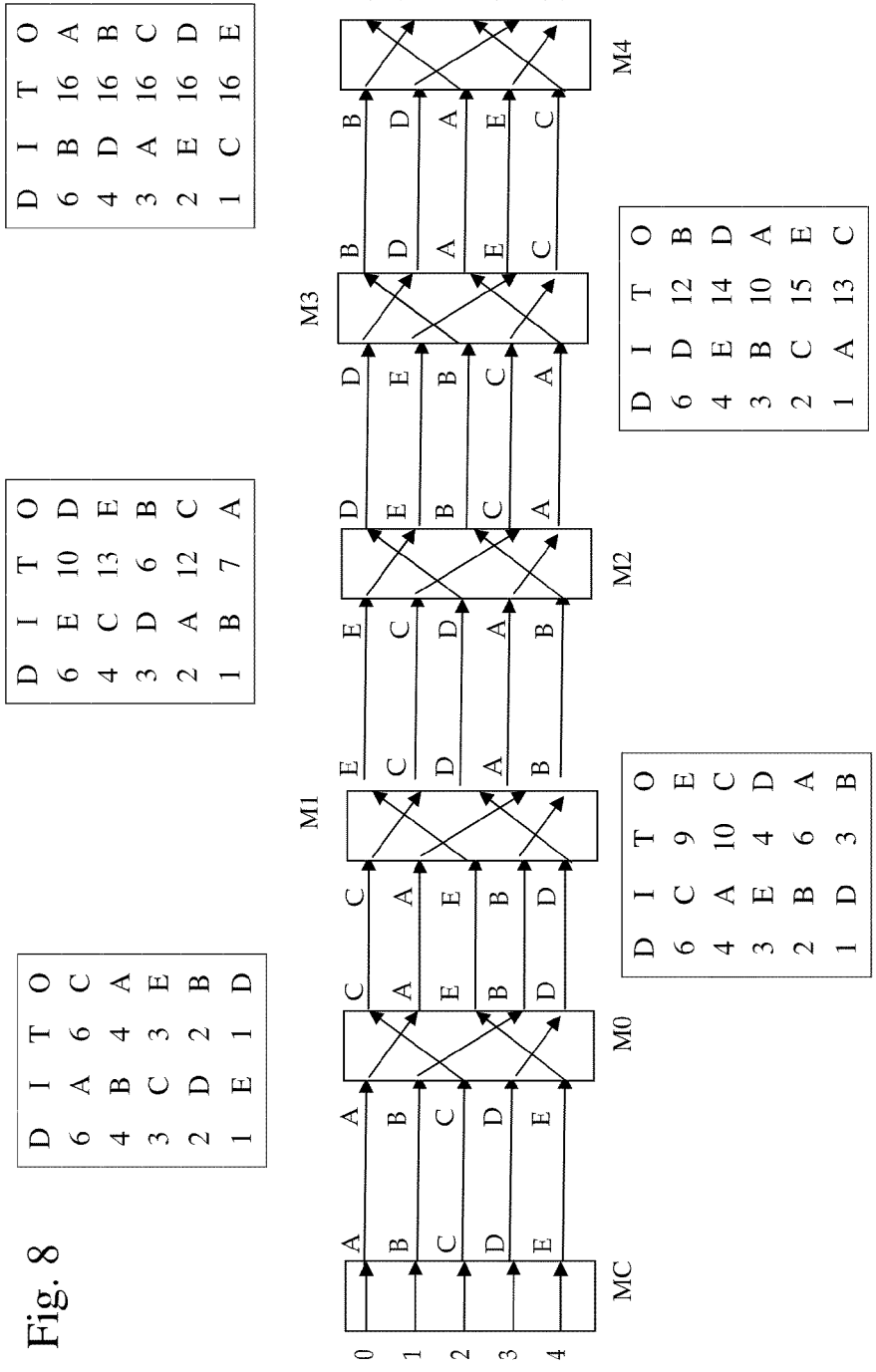
FIG. 8 illustrates a linear arrangement of nodes having a different swapping pattern from that of FIG. 7.

Another of the lane-to-line exchange permutations which may be employed is shown in FIG. 8. This type of exchange may be termed a "shuffle". In this example, the ordering of the data lane assignments at the input and the output of a chain of modules is identical, and the total time delay is 16 units. The differential time delay (skew) is 0 at the end module. As this pattern would repeat after another 5 modules, the extension of this bus has a lesser accumulation of total delay and the differential delay is bounded to the maximum differential delay over the first 5 modules. In this example, the maximum time delay skew is 7, regardless of the bus length.

Figure 9:
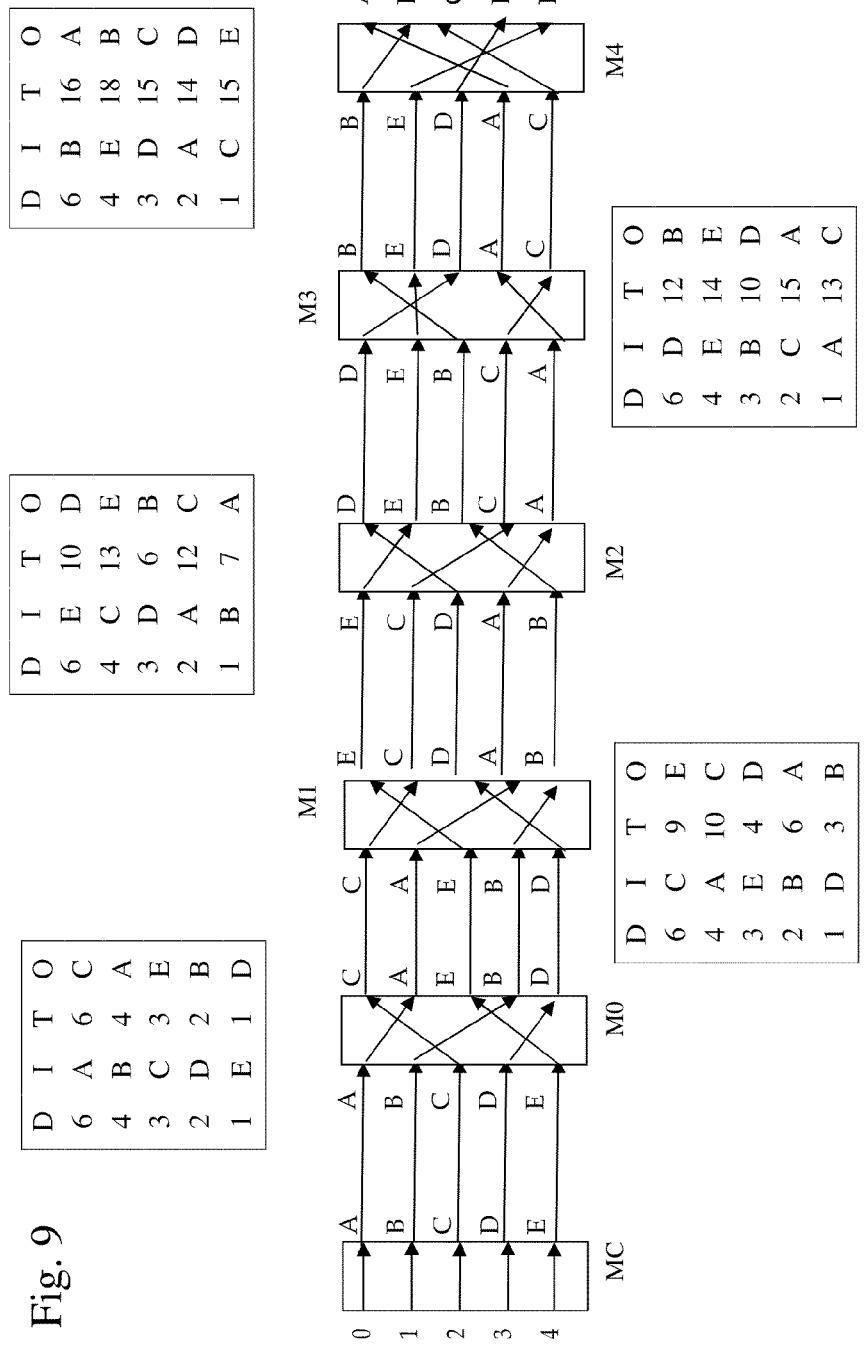
FIG. 9 illustrates a linear arrangement of nodes having a different swapping pattern from that of FIGS. 7 and 8.

While a fixed pattern of exchanges has been shown in FIGS. 8 and 9, this is not a restriction and, for example, both permutation types may be used in a design. Moreover, while the exchanges are shown as being performed on a module, the exchanges may be performed on a motherboard, or in whole or in part. For example, exchanges may be performed on groups of 4 lines of a total of 8 lines on the modules, for example by shuffling, and exchanges performed on the mother board to interchange each group on the mother board, when a sufficient differential skew between the groups has accumulated. These choices are influenced by the specific time delays associated with a design and the allocation of functionality to the modules, to the semiconductor devices and to the motherboard.

FIG. 9 shows yet another example of a mixture of permutations where the exchanges are shown as occurring on a module.

One method of performing the permutation exchanges is by arranging the wiring of a module. FIG. 10 shows a plan view of a module. A notch is shown in the upper right hand corner to indicate the orientation of layers of the board. In FIG. 10a, the upper view represents a view of a top layer as viewed from above, whereas the bottom layer is understood to be positioned under the top layer such that the notch is aligned therewith. The chip, which may be a CSE, AMB or the like, is shown in a solid outline in the top layer, but as a dotted line in the bottom layer to indicate that the chip is positioned on or above the top layer. The dotted line shows the projected position of the chip on the bottom layer so that the locations to connections thereto by, for example, vias, wires, or the like, may be understood.

FIG. 10a illustrates a full exchange permutation occurring within the chip. The top layer may be used for the input lines, and the lines are designated as 0 through 4, from left to right. The output lines, on the bottom layer are designated as 0 through 4 from right to left. In this manner the data input on line 0 at the left hand side of the chip are output at the line 0 at the right hand side of the chip. The data on line 4 are similarly interchanged from right to left (input to output). This performs the interchange shown in FIG. 7.

Using the same input configuration as FIG. 10a (top layer), FIG. 10b illustrates a shuffle interchange. As previously, the input lines 0 through 4 are disposed from left to right. The output lines are 0 through 4, disposed from left to right, however the orientation of the traces leading between the chip and the board edge is disposed so as to result in the shuffle exchange of lines as in FIG. 8. In this and other figures where the distances are not dimensioned, it should be understood that any of the distances shown may not be even relatively to scale. Rather, the illustrations are conceptual and the designer will appreciate that the actual delays are taken into account in the board layout or configuration of switches.

Figures 11A, 11B:
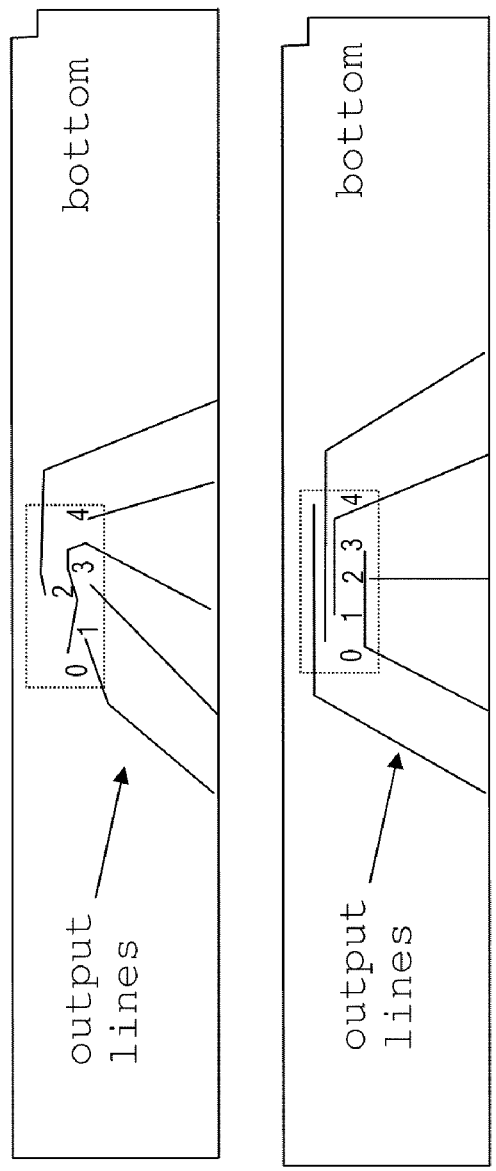
FIGS. 11 (a) and (b) illustrates another arrangement of output lines.

FIG. 11a shows an example of a shuffle interchange such as in FIG. 10b, where the output lines are routed on a single layer. In these representations, the input and output pins or connections to the chip having the same number, e.g., 0, are located in close proximity to each other such that differential time delay due to the offset between the pins is minimal for design purposes. Other arrangements are possible that may include consideration of this differential delay. As clock speeds increase these aspects may be taken into account in design.

FIG. 11b is an example of a symmetrical swap as in FIG. 10a where the input and output traces are on the same board layer. Access to the pins or connections to the chip may be by leads, ball grid connection, and the like, or other technologies being developed, such as by lightwave.

Figure 12A:
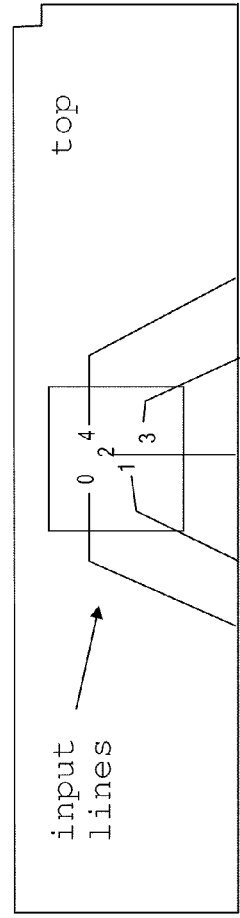
FIGS. 12 (a), (b) and (c) illustrates yet another arrangement of output lines where a ball grid array (BGA) is used as the circuit interface.
Figure 12B:
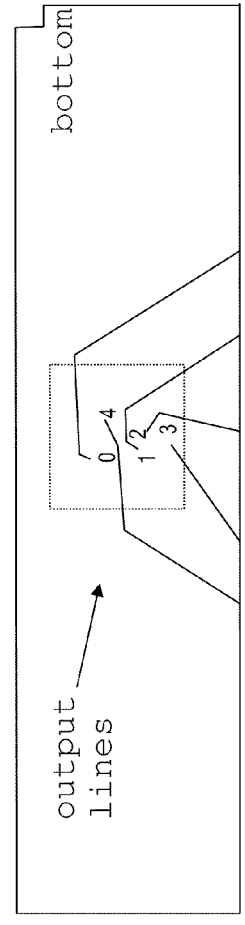
Figure 12C:
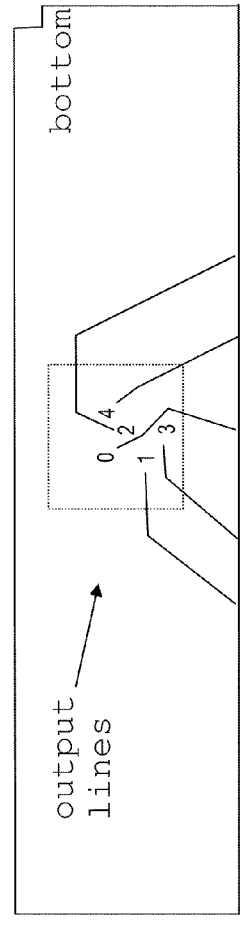

FIG. 12 shows another example of connecting to a chip and the routing of lines so as to effect an exchange permutation by using the module printed circuit layout. Using the same drawing conventions as FIG. 11, FIG. 12a shows the inputs to the chip. The output line routing in FIG. 12b results in a full exchange as in FIG. 10a, and the output line routing in FIG. 12c results in a shuffle exchange as, for example, in FIG. 10b. This arrangement may be used, for example, with a flip chip module.

Figures 13A, 13B:
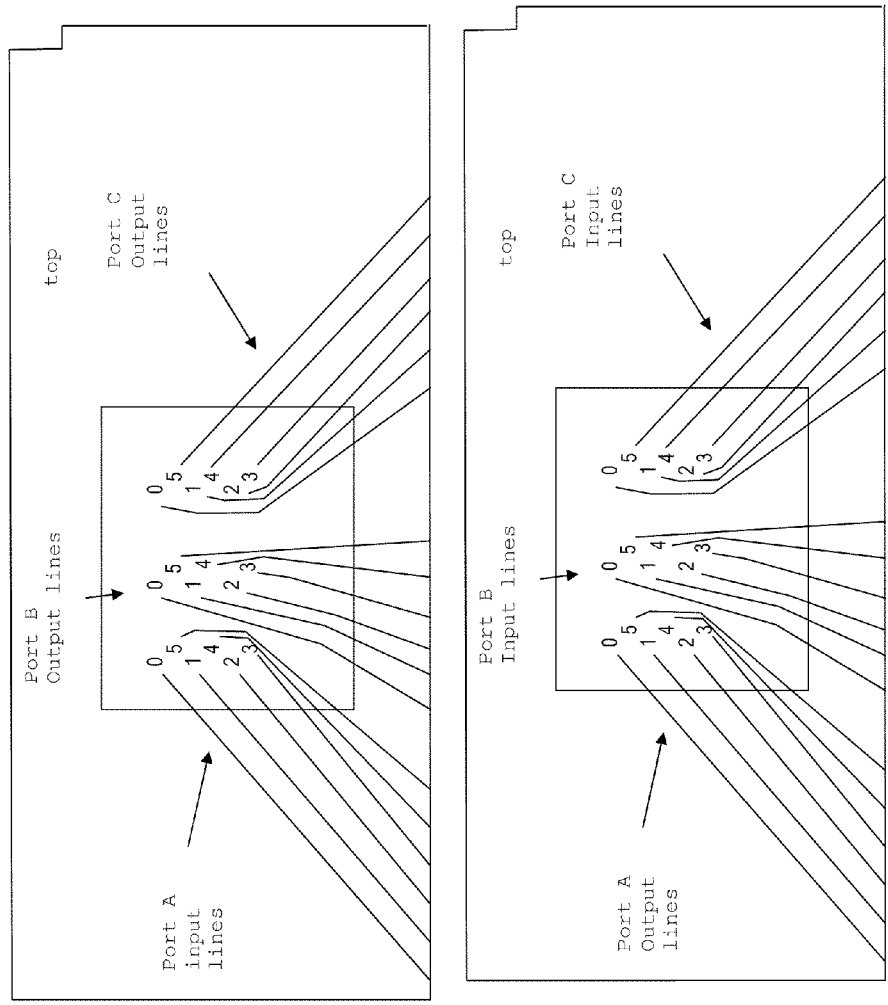
FIGS. 13 (a) and (b) illustrate an example of the input and output lines where there are more than two ports in a node.

Although the line exchanges have been described using a node or module with one input port and one output port, this is not a restriction. FIG. 13a shows a chip having three ports, A, B, C. Again, while only a single direction of signal propagation is shown, the devices may be configured for bidirectional transmission on each line or port, and both northbound and southbound directions may use line exchanges. The diagrams are simplified for illustrative purposes.

Port A input lines and port B and C output lines are shown disposed on the top layer of the board, connecting the pins or balls of the chip to an edge of the module. FIG. 13b shows port A output lines and port B and C input lines.

Figure 14B:
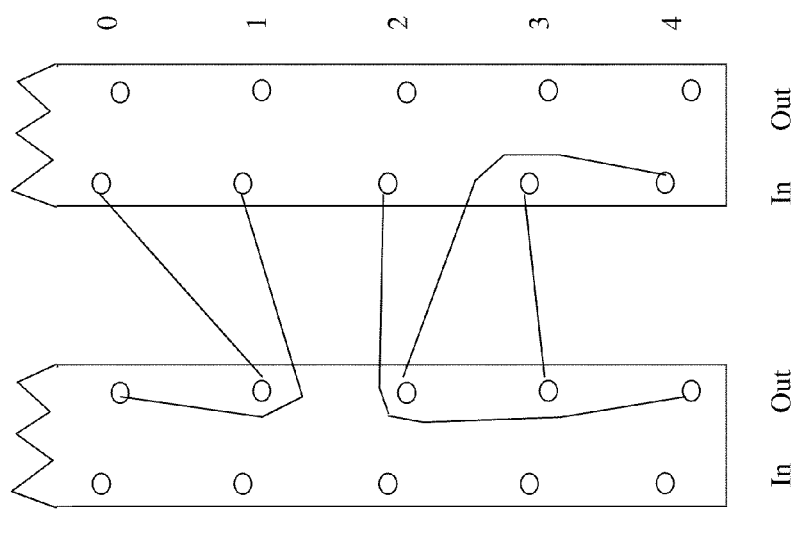
FIGS. 14 (a) and (b) illustrate that the differential skew may be reduced using differing trace lengths on a mother board.
Figure 14A:
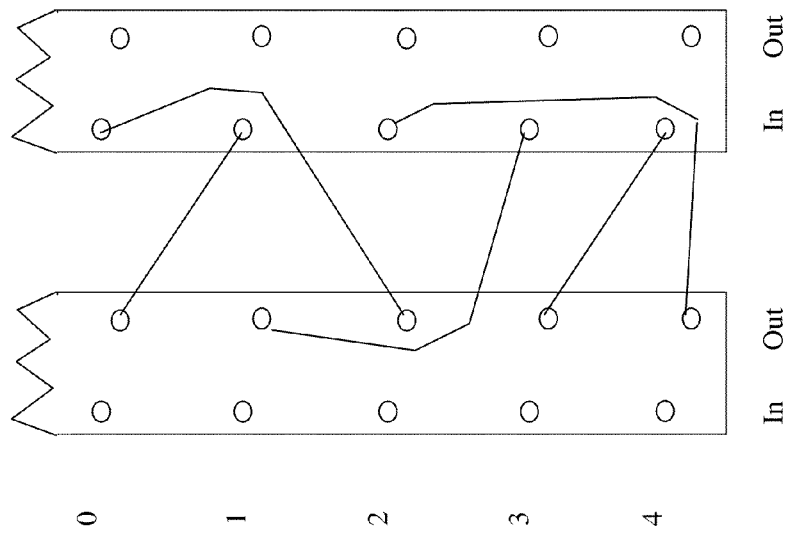

Exchanges may be performed either partially or wholly on a mother board having connectors for receiving modules. FIG. 14a shows two board wiring configurations which may be used in shuffle exchanges of data during the passage between adjacent connectorized memory modules. FIG. 14a is suitable for the configuration of M0 in FIG. 9 and FIG. 14b is suitable for the configuration of FIG. 9. Although the description is presented in terms of connectorized modules being plugged into a mother board, this only one possible realization of the technique. The components may be directly connected without the use of connectors, or some or all of the components may be incorporated on a single substrate, or the like. Further, the means of connection may include optical techniques such as laser links as well as conductive connections.

Figure 15:
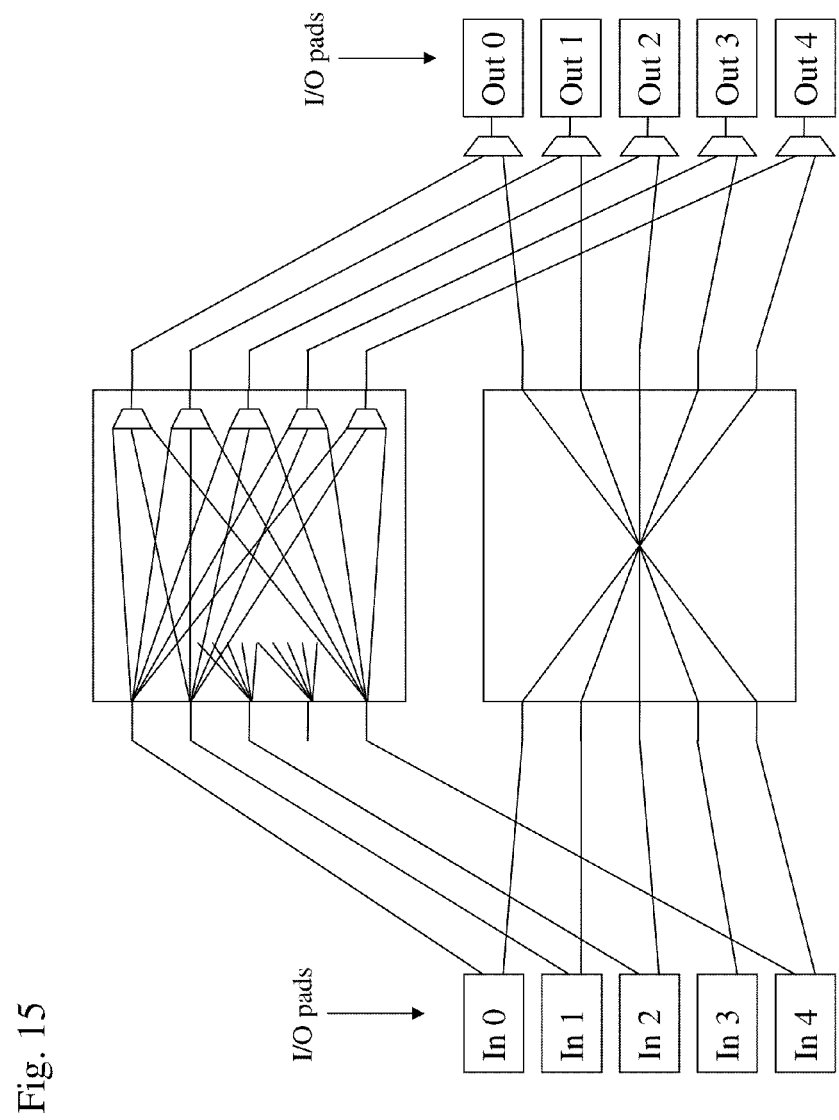
FIG. 15 illustrates an example of a switch where a combination of fixed interchanges and fully configurable interchanges may be performed.

FIG. 15 is similar to FIG. 6, however in FIG. 15 a selection may be made between connection between the input terminals the output terminals through a fixed network or a switch where the configuration of the connections may be changed. The pin arrangement may, for example, be similar to that in FIG. 12. The use of the fixed network may lead to a lower time delay between the input and the output pins and thus a lower overall delay, however the switch may be used in order to compensate for time delays at a location along the bus where other exchanges may be used to control the skew. In particular, the arrangement of the pins for specific lines (e.g., 1 and 3) may be arranged such that the overall delay is sufficiently small that the same clock domain may be used for operation of the input and output circuitry.

Figure 16:
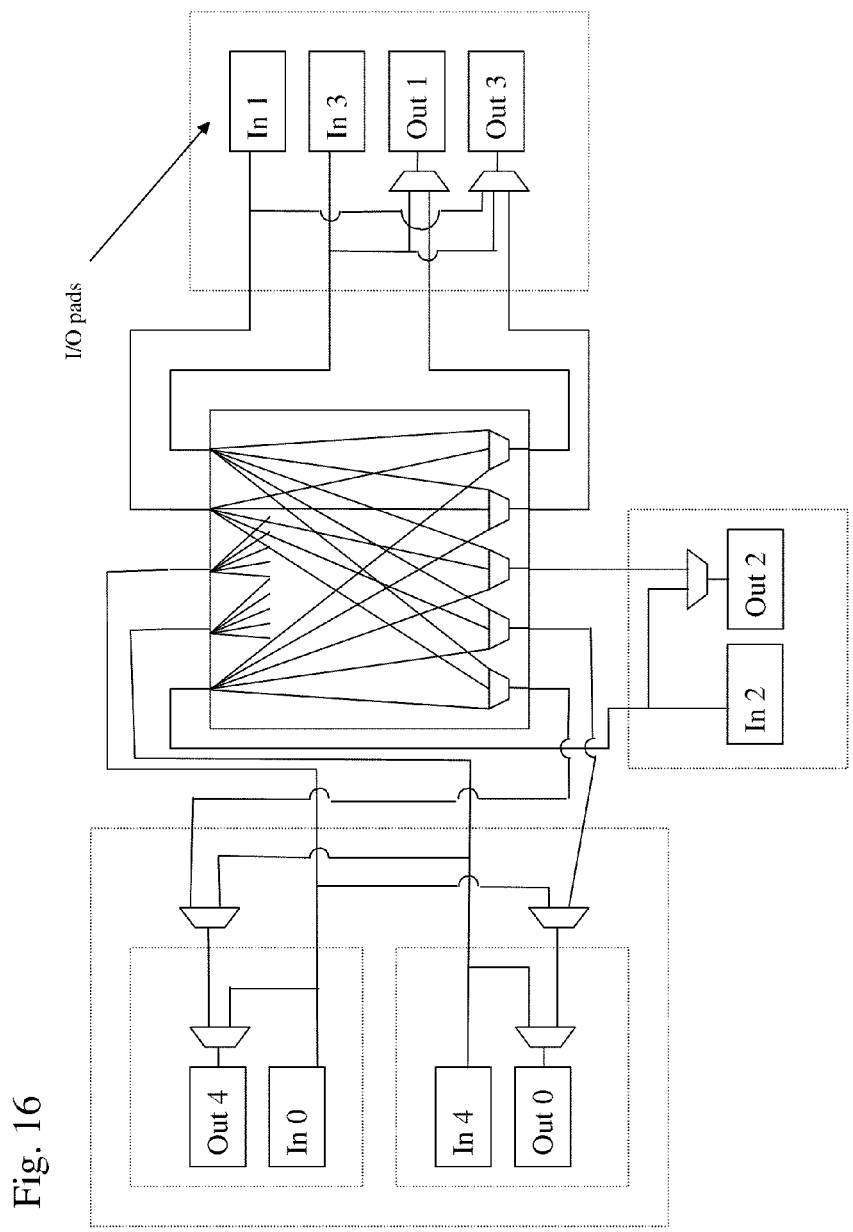
FIG. 16 illustrates an example of configurable switch where there are more than two ports in the node.

FIG. 16 shows an example of an arrangement of components in a CSE. In this example I/O pads may be located on the perimeter of the chip that may correspond to a CSE such as shown in FIG. 12a where the arrangement is configured to produce a full swap of the signals, while the output traces may be routed similarly to the input traces show in FIG. 12a rather than as shown in FIG. 12b.

A light grey line surrounds groups of components which may operate within a local clock domain. Operation in differing clock domains may result from internal signal propagation delays, or even when the same clock domain may be buffered prior to use with each of the areas within a local clock domain. A signal crossing a box edge may be experience a greater delay than a signal entirely within a box.

A signal arriving at input 0 may be output through output 4 with less delay than routing the signal to output 0, and even less delay than to send the input signal to outputs 1, 2 or 3. Inputs 1 and 3 may be routed either outputs 1 or 3 with an equal delay, but to outputs 0, 2 or 4 with a higher delay.

When using local switching near the I/O pads, for example, the multiplexers shown for the direct routing of input line 0 to output line 4, the central switch shown connecting all inputs to all outputs may retain full switch in functionality, or a subset thereof. For example, the central switch might omit the capability to route input line 0 to output line 4, as that capability would be redundant with the switching function near the I/O pad. This is similar to the arrangement shown in FIG. 6 where the non-fixed switching function may not capable of performing all possible rearrangements of the input signal logical assignments to output signal logical assignments.

Figure 17:
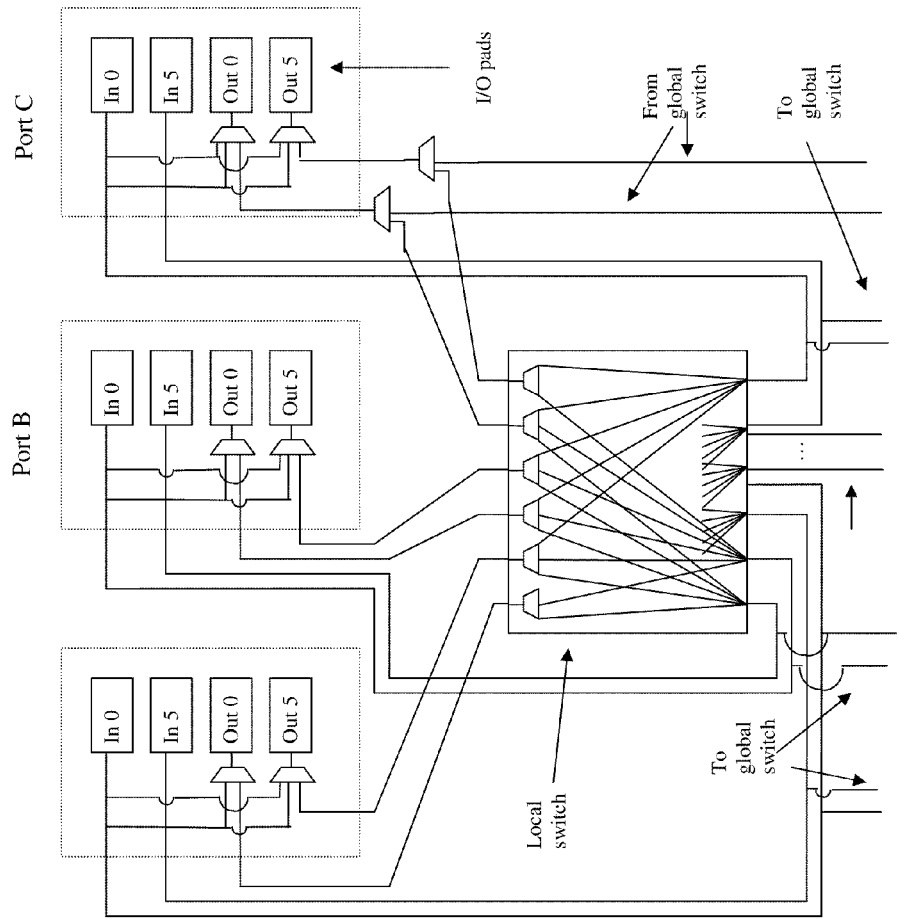
FIG. 17 illustrates a configurable switch where some exchanges may be performed within or near the I/O pads of a port, where some exchanges may be performed in a switch local to the I/O pads and where other exchanges may be performed through one or more global switches (not shown).

FIG. 17 shows a portion of the arrangement of another CSE, using I/O pads located on an area I/O flip-chip that may correspond to a CSE such as shown in FIG. 13a. That the placement of the I/O connections may result in a low delay for signals routed from inputs 0 or 5 of port A to outputs 0 and 5 of port A, and a higher delay for signals routed to outputs 0 or 5 of ports B and C by passing through the local switch. Signals sent from the input lines 0 or 5 of any of ports A, B or C to output lines 1, 2, 3 or 4 of any port may experience a higher delay when sent to a global switch (not shown) of which there might be more than one. The delay for signals from I/Os that pass through one or more non-local switches may be reduced by having direct connections along some paths such as where port C is shown receiving signals directly from the global switch rather than through the local switch such as for port A and port B.

The description herein has used modules, which may be connectorized, a mother board, and the like as examples. However the apparatus and method may be used in conjunction with devices mounted on a substrate, as integrated circuits, as multi-chip modules, or the like. As the density of electronic modules continues to increase, such construction may be convenient to use.

Although the present invention has been explained by way of the examples described above, it should be understood to the ordinary skilled person in the art that the invention is not limited to the examples, but rather that various changes or modifications thereof are possible without departing from the spirit of the invention.

What is claimed is:

1. A node, comprising:
   a switch; and
   an input port and an output port, each port having first, second, third and fourth lines, the input port receiving a data word on at least a pair of lines of the first, second third and fourth lines, data bits of the data word having a differential time delay therebetween,
   wherein the switch is configurable to communicate between the input port and the output port so that the data bits of the data word received on the pair of lines of the input port are routed to a pair of lines of the output port and the pair of output lines is selected based on at least the differential time delay of the data bits of the data word;
   the node further comprising:
   a second output port, having first, second, third and fourth lines,
   and to select between the first output port and the second output port so that the data bits of received on the pair of lines of the input port are routed to a pair of output lines of the second output port, the pair of output lines being selected based on at least the differential time delay of the received data word.

2. The node of claim 1, further comprising a memory circuit, communicating with at least one of the input port or the output port.

3. A method for compensating for data skew in an interconnection system, the method comprising:
   providing a node connectable to a signal bus, the node comprising at least a switch, a plurality of input lines and a plurality of output lines;
   determining a first differential time delay of data bits of a data word received on a pair of input lines of the node; and
   configuring the switch such that the data bits of the data word received on the pair of input lines of the node are routed to a pair of output lines of the node,
   wherein the pair of output lines is selected based on the first differential time delay such that the data bits of the data word received at a second node are received with a second differential time delay that is different from the first differential time delay, when the second differential time delay is determined at the second node.

4. The method of claim 3, wherein a line of the input lines of the node communicates with an output line of the output lines of the node, independent of the switch configuration.

5. The method of claim 3 wherein a word comprises two or more bits.

6. The method of claim 3, wherein the switch is configured prior to receipt of the data word.

7. A method for compensating for data skew in an interconnection system, the method comprising:
   providing a node connectable to a signal bus, the node comprising at least a switch, a plurality of input lines and a plurality of output lines;
   determining a first differential time delay of data bits of a data word received on a pair of input lines of the node;
   configuring the switch such that the data bits of the data word received on the pair of input lines of the node are routed to a pair of output lines of the node; and
   determining the first differential time delay prior to receipt of the data word,
   wherein the pair of output lines is selected based on the first differential time delay.

8. A method for compensating for data skew in an interconnection system, the method comprising:
   providing a node connectable to a signal bus, the node comprising at least a switch, a first output port and a second output port, a plurality of input lines and a plurality of output lines;
   determining a first differential time delay of data bits of a data word received on a pair of input lines of the node; and
   configuring the switch such that the data bits of the data word received on the pair of input lines of the node are routed to a pair of output lines of the node,
   wherein the pair of output lines is selected based on the first differential time delay and the pair of output lines of the first output port or second output port selected depends on the output port of the first and second output ports that is selected.

9. A node, comprising:
   a switch; and
   an input port and an output port each port having first, second, third and fourth lines, the input port receiving a data word on at least a pair of lines of the first, second third and fourth lines, data bits of the data word having a differential time delay therebetween,
   wherein the switch is configurable to communicate between the input port and the output port so that the data bits of the data word received on the pair of lines of the input port are routed to a pair of lines of the output port and the pair of output lines is selected based on at least the differential time delay of the data bits of the data word; and, the differential time delay is determined at output terminals of the node.

10. A node, comprising:
    a switch; and
    an input port and an output port, each port having first, second, third and fourth lines, the input port receiving a data word on at least a pair of lines of the first, second third and fourth lines, data bits of the data word having a differential time delay therebetween, wherein the switch is configurable to communicate between the input port and the output port so that the data bits of the data word received on the pair of lines of the input port are routed to a pair of lines of the output port and the pair of output lines is selected based on at least the differential time delay of the data bits of the data word; and, the differential delay is determined at an input to the switch.

* * * * *